United States Patent [19]

Garg et al.

[11] Patent Number: 4,855,188

[45] Date of Patent: Aug. 8, 1989

[54] HIGHLY EROSIVE AND ABRASIVE WEAR RESISTANT COMPOSITE COATING SYSTEM

[75] Inventors: Diwakar Garg, Macungie; Paul N. Dyer, Allentown; Leslie E. Schaffer, Macungie; Ernest L. Wrecsics, Bethlehem, all of Pa.; Duane Dimos, Upper Mount Clair, N.J.; Carl F. Mueller, Easton, Pa.

[73] Assignee: Air Products and Chemicals, Inc., Allentown, Pa.

[21] Appl. No.: 153,738

[22] Filed: Feb. 8, 1988

[51] Int. Cl.[4] .............................................. B32B 15/04

[52] U.S. Cl. .................................... 428/627; 428/628; 428/665; 428/680

[58] Field of Search ................ 428/627, 628, 665, 680

[56] References Cited

U.S. PATENT DOCUMENTS 3,389,977 6/1968 Tarver ................................ 428/627

4,741,975 5/1988 Naik et al. ........................... 428/665

4,761,346 8/1988 Naik .................................... 428/627

*Primary Examiner*—Melvyn J. Andrews

*Assistant Examiner*—George Wyszomieski

*Attorney, Agent, or Firm*—Richard A. Dannells, Jr.; William F. Marsh; James C. Simmons

[57] ABSTRACT

A highly erosive and abrasive wear resistant composite coating system is described in which an intermediate layer of substantially pure tungsten is deposited on a substrate. An outer layer is then deposited comprised of a mixture of tungsten and tungsten carbide, with the tungsten carbide consisting of $W_2C$, $W_3C$ or a mixture of both. The thickness of the intermediate layer is sufficient to confer substantial erosive and abrasive wear resistance characteristics on the composite coating system. The ratio of the thickness of the intermediate layer to the thickness of the outer layer is controlled and is at least above 0.30 in the cases of $W+W_3C$, $W+W_2C+W_3C$ and $W+W_2C$ coatings.

16 Claims, 9 Drawing Sheets

→ INCREASING LOAD

HIGHLY EROSIVE AND ABRASIVE WEAR RESISTANT COMPOSITE COATING SYSTEM

BACKGROUND OF THE INVENTION

A. Field of the Invention

The invention relates to highly erosive and abrasive wear resistant composite coating. More particularly, the invention relates to an improved highly erosive and abrasive wear resistant coating comprising a composite coating system of an intermediate layer of substantially pure tungsten and an outer two phase layer of a mixture of tungsten and tungsten carbide.

B. Background Art

High hardness materials are widely used as coatings on various type of mechanical components and cutting tools. Such coatings impart erosion and abrasion wear resistance and thus increase the erosive and abrasive wear life of objects that have been coated. The high hardness materials can also be used to produce free standing objects which are erosive and abrasive wear resistant.

Chemical vapor deposition processes can be used to produce highly erosive and abrasive wear resistant hard coatings and free standing objects. In a typical chemical vapor deposition (CVD) process, the substrate to be coated is heated in a suitable chamber and then a gaseous reactant mixture is introduced into the chamber. The gaseous reactant mixture reacts at the surface of the substrate to form a coherent and adherent layer of the desired coating. By varying the gaseous reactant mixture and the CVD process parameters, various types of deposited coatings can be produced.

In co-pending U.S. patent application Ser. No. 92,809, filed Sept. 3, 1987, extremely hard, fine grained, non-columnar, substantially lamellar tungsten/carbon alloys are described which are produced by chemical vapor deposition. The described alloys consist primarily of a mixture of a substantially pure tungsten phase and at least one carbide phase wherein the carbide phase consists of $W_2C$ or $W_3C$ or a mixture of $W_2C$ and $W_3C$. The disclosed tungsten/carbon alloys are free of columnar grains and consist essentially of extremely fine, equiaxial crystals.

It has been found that the tungsten/carbon alloys such as those described in the aforementioned U.S. patent application, when deposited upon certain types of substrates, exhibit a very fine micro-crack system throughout the deposit. On many types of substrates and under many types of erosive and abrasive wear conditions, preferential attack occurs at the cracks, resulting in poor erosion and abrasion wear resistance for such coatings.

The use of an intermediate layer of substantially pure tungsten followed by a tungsten carbide coating is described in the prior art. For example, U.S. Pat. No. 3,389,977 discloses a method of depositing substantially pure tungsten carbide in the form $W_2C$ wherein the adherence of $W_2C$ to a steel substrate is improved by first cleaning the surface and then depositing a thin film of tungsten. The thin film of tungsten is deposited at or above 600° C., making the use of the deposition process unsuitable for providing erosive and abrasive wear resistance coating on various carbon steels, stainless steels, nickel and titanium alloys without severely degrading their mechanical properties. Additionally, pure $W_2C$ deposited according to this patent consists of columnar grains as opposed to non-columnar grains described in the present patent application. Other instances of the use of very thin tungsten intermediate layers, often as a diffusion layer, are reported in other prior art in order to improve adhesion of tungsten carbide on a substrate. However, there is no report in the prior art of the effect of a tungsten interlayer on coating properties of the final coating system nor has the effect of such a tungsten intermediate layer on the reduction or elimination of cracks in the outer coating been reported.

SUMMARY OF THE INVENTION

Very generally, the highly erosive and abrasive wear resistant composite coating system of the invention comprises an intermediate layer of tungsten and an outer layer of tungsten/carbon alloy coating. The intermediate layer of tungsten is of sufficient thickness to confer substantial erosive and abrasive wear resistance characteristics to the composite coating system. The outer tungsten/carbon alloy layer is comprised of a mixture of tungsten and tungsten carbide, with the tungsten carbide phase comprising of $W_2C$, $W_3C$ or a mixture of both. The ratio of the thickness of the intermediate or inner layer to the thickness of the outer layer is at least above 0.3 in the cases of $W+W_3C$, $W+W_2C+W_3C$ and $W+W_2C$ coatings. Preferably the ratio of the thickness of the inner layer to the thickness of the outer layer to get optimum erosion and abrasion wear performance is at least 0.35 in the case of mixtures of tungsten and $W_2C$ in the outer layer, 0.60 in the case of mixtures of tungsten and $W_3C$ in the outer layer and, 0.35 in the case of mixtures of tungsten and $W_2C$ and $W_3C$ in the outer layer.

The tungsten/carbon alloys or coatings consisting of a mixture of tungsten and tungsten carbide, with the tungsten carbide phase comprising $W_2C$, $W_3C$ or mixtures of both are defined herein as tungsten/tungsten carbide to simplify the description.

DETAILED DESCRIPTION OF THE INVENTION

Figure 1:
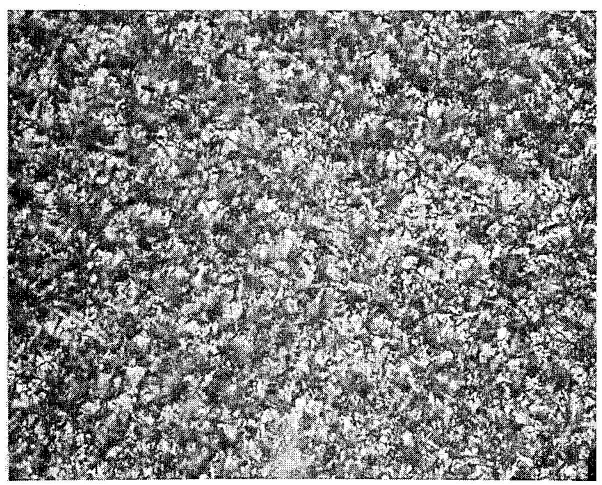
FIG. 1 is the photomicrograph at 1,000 magnification of the tungsten coating on AM-350 stainless steel showing a rough surface finish but the absence of cracks.

In a preferred form of the invention, the intermediate layer of tungsten is produced by chemical vapor deposition under sub-atmospheric to slightly atmospheric pressure, i.e., within the range of about 1 Torr. to about 1,000 Torr., at a temperature of about 300° to about 650° C., using a mixture of tungsten halide such as $WF_6$, hydrogen, and an inert gas such as argon. The intermediate layer is of a sufficient thickness to confer substantial erosive and abrasive wear resistance characteristics on the composite system. The specific thickness necessary to do this for various composite coating systems will become readily apparent to those skilled in the art from the teaching of this specification, particularly in connection with the examples set forth below. The intermediate layer of tungsten should be at least about two microns thick and, for most systems, will be greater than about three microns.

Following deposition of the intermediate layer of substantially pure tungsten, an outer layer of tungsten/-tungsten carbide is deposited under sub-atmospheric to slightly atmospheric pressure, i.e., within the range of about 1 Torr. to about 1,000 Torr., at temperatures in the range of about 300° to about 650° C. This outer layer may be either a two phase layer comprising tungsten and $W_2C$ or tungsten and $W_3C$. Alternatively, this outer layer may be a three phase layer comprising tungsten, $W_2C$ and $W_3C$. The relative proportions of the tungsten, $W_2C$, and $W_3C$ may be selected in accordance with the particular properties desired in the final composite coating system. In order to achieve such proportions, the tungsten/tungsten carbide deposit is applied utilizing a flow of tungsten halide such as $WF_6$, argon, hydrogen and an oxygen containing hydrocarbon such as dimethylether (DME). By controlling the temperature, W/C atomic ratio in the feed gas and the ratio of hydrogen to $WF_6$ during the deposition reaction, the particular desired chemical composition of the tungsten/tungsten carbide layer may be obtained. Details of the foregoing described process may be found in applicant's co-pending U.S. patent application Ser. No. 92,809.

In accordance with the present invention, it has been found that the ratio of the thickness of the inner tungsten layer to the thickness of the outer multi-phase tungsten/tungsten carbide layer has a profound affect on the erosive and abrasive wear resistance properties of the resulting composite coating system. Although the reasons for this improvement in the erosive and abrasive wear resistance are yet not fully understood, it is believed that the use of the tungsten intermediate layer together with the specified ratios set forth below refine the micro-crack structure in the outer deposit so that, even though preferential attack along the crack system occurs, the rate of attack is greatly attenuated. Moreover, as set out below, under certain conditions a crack free outer layer may be achieved.

More specifically, the ratio of the thickness of the inner tungsten layer to the thickness of the outer tungsten/tungsten carbide layer, in accordance with the composite coating system of the invention, is at least above 0.30 with the $W+W_3C$, $W+W_2C+W_3C$ and $W+W_2C$ coatings. More specifically, to obtain optimum erosion and abrasion wear performance the thickness ratio is at least: 0.35 in the case of mixtures of tungsten and $W_2C$ in the outer layer, 0.60 in the case of mixtures of tungsten and $W_3C$ in the outer layer, and 0.35 in the case of mixtures of tungsten and $W_2C$ and $W_3C$ in the outer layer. Using these minimum ratios, superior erosive and abrasive wear resistance can be achieved. Moreover, by using the ratios set forth above, under certain conditions, completely crack free outer layers may be achieved.

The inner tungsten layer is substantially columnar in its grain structure with the longer dimension of the grains extending generally perpendicular to the substrate surface. On the other hand, the grain structure of the tungsten/tungsten carbide outer layer is very fine-grained, equiaxed, non-columnar, and substantially lamellar typically of the order of one micron or less in size. Such structures may be readily achieved using the method described in the aforementioned co-pending U.S. patent application.

The present composite coating system of the invention can be deposited on a number of ferrous metals and alloys such as cast irons, carbon steels, stainless steels and high speed steels, non-ferrous metals and alloys such as copper, nickel, platinum, rhodium, titanium, aluminum, silver, gold, niobium, molybdenum, cobalt, tungsten, rhenium, copper alloys and nickel alloys such as inconel and monel, titanium alloys such as Ti/Al/V, Ti/Al/Sn, Ti/Al/Mo/V, Ti/Al/Sn/Zr/Mo, Ti-/Al,V/Cr, Ti/Mo/V/Fe/Al/, Ti/Al/V/Cr/Mo/Z and Ti/Al/V/Sn alloys, non-metals such as graphite, carbides such as cemented carbide, and ceramics such as silicon carbide, silicon nitride, alumina, etc. In depositing the composite coating system on reactive substrate materials, such as cast irons, carbon steels, stainless steels, high speed steels, and nickel and monel alloys, it is preferred to coat the substrate first with a more noble material such as nickel, cobalt, copper, silver, gold, platinum, palladium or iridium, by electrochemical or electroless techniques or by a physical vapor deposition technique such as sputtering. In depositing the composite coating system on reactive titanium or titanium alloys, it is also preferred to coat the substrate first with a more noble material described above by electroless technique or by physical vapor deposition technique such as sputtering. It is also preferred to coat the substrate first with a thin layer of a more noble material described above by electroless technique followed by another thin layer of a more noble material by electrochemical or physical vapor deposition technique. It is also preferred to clean the surface of the titanium or titanium alloy substrate first and heat treat the noble metal deposit after depositing on the substrate. The deposition of noble metal and subsequent heat treatment steps on titanium or titanium alloys are described in detail in co-pending U.S. patent application Ser. No. 07/139,891, filed Dec. 31, 1987. It is also preferred that upper limit of the deposition temperature be about 525° C. when depositing the present composite coating system on titanium and titanium alloys to minimize the degradation of the mechanical properties. No deposition of the noble material, however, is required for coating non-reactive materials such as copper, nickel, cobalt, silver, gold, platinum, rhodium, niobium, molybdenum, tungsten, rhenium, graphite, carbides and ceramics. Free standing parts of the composite coating of the present invention can be made by depositing it on the substrates such as copper, nickel, cobalt, silver, gold, molybdenum, rhenium, and graphite and then removing these substrates by grinding and chemical or electrochemical etching.

To further illustrate the present invention, the following data are set forth with respect to a number of coating systems.

A number of ferrous and non-ferrous metals and alloys were used as substrates in the following coating experiments. Specimens of AM-350 and SS-422 stainless steels Inconel and IN-718, a well known nickel alloy, were electroplated with 2 to 5 μm thick nickel before coating them with tungsten and tungsten/tungsten carbide to protect them from the attack of hot and corrosive HF acid gas produced as a by-product in the CVD process. Specimens made of titanium alloy such as Ti/6Al/4V, on the other hand, were plated with 2 to 5 μm thick nickel using an electroless technique described in detail in co-pending U.S. patent application Ser. No. 07/139,891, filed Dec. 31, 1987 before coating them with tungsten and tungsten/tungsten carbide.

Erosion Test Procedure

The erosion resistance performance of the uncoated and the coated specimens was determined using a miniature sandblast unit; the test parameters are summarized in Table 1. The fine alumina powder, which was used as the erosive material, provided a very harsh erosion environment, as compared to sand erosion; consequently, an accelerated test procedure could be used. Two essentially equivalent techniques were used to evaluate the erosion resistance of the specimens. The first technique involved measuring the time it took for the erosive material to penetrate the tungsten/tungsten carbide coating, which is called the breakthrough time. Penetration of the tungsten/tungsten carbide coating was visibly apparent as a color change at the center of the erosion pit; the fact that this color change corresponded to the initial penetration of the tungsten/tungsten carbide coating was confirmed by microscopic examination of erosion pits in cross section. The second technique involved measuring the weight of a specimen that was lost during an erosion test for a given time; this time was always less than the breakthrough time so that only the weight loss of the coating was measured. The erosion rate was then calculated as the time required to penetrate the coating on a per mil basis or as the average weight loss for a 30 second erosion test, respectively.

EXAMPLES

Example 1

Uncoated specimens of AM-350 stainless steel and Ti/6Al/4V were eroded with alumina for two minutes (120 seconds). The depth of the crater was measured to calculate the erosion rate. The calculated erosion rate as 60 and 50 seconds/mil for AM-350 and Ti/6Al/4V specimens, respectively.

EXAMPLE FOR TUNGSTEN COATING

Example 2

A number of AM-350, Ti/6Al/4V and IN-718 specimens (0.095 inch×1 inch×2 inch) were placed in an inductively heated graphite furnace inside a gas-tight quartz envelope. The specimens were heated to 460° C. in the presence of flowing argon gas and at the temperature a gaseous mixture of 300 cc/min of $WF_6$, 3,000 cc/min of hydrogen, and 4,000 cc/min of argon was passed into the furnace over the specimens. The total pressure within the system was maintained at 40 Torr. The deposition was conducted for 15 minutes; thereafter, the flow of the reactive gases was stopped and the specimens were cooled.

Figure 2:
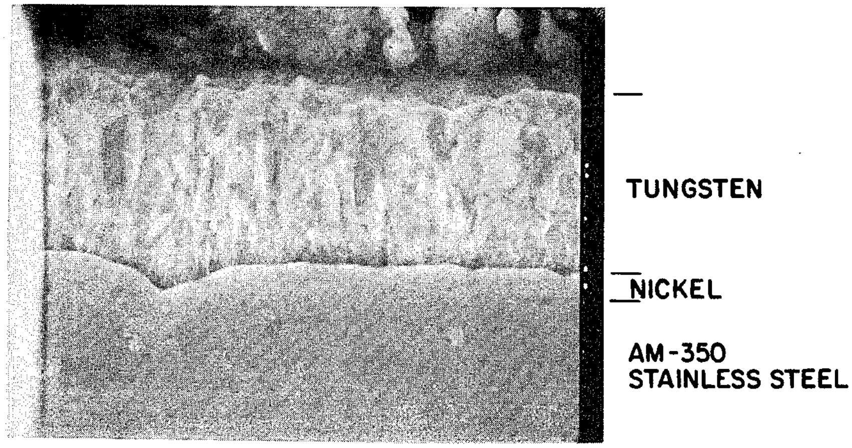
FIG. 2 is the cross-sectional view at 3,000 magnification of the tungsten coating on AM-350 stainless steel showing columnar growth structure.

The specimens were found to be coated with a dull, adherent, coherent, and uniform coating. The coating thickness on stainless steel specimens was ~12 μm on each side (see Table 2). The coating had a rough surface finish and was free of cracks, as shown in the FIG. 1. The coating consisted of columnar growth structure, as shown in the FIG. 2. X-ray diffraction analysis showed the presence of only tungsten in the coating. It had a hardness of 455 Vickers, as shown in Table 3. The coating showed very poor erosion performance; time required to penetrate the coating was only 3 seconds, resulting in a erosion rate of 6 seconds/mil. This, therefore, indicated that CVD tungsten could not be used to provide erosion protection.

TABLE 1

| Erosion Test Procedure | |
|---|---|
| Nozzle Diameter | 0.018 inch |
| Stand off Distance | 0.6 inch |
| Erosion Media | Fine Alumina Powder (50 μm Average Particle Size) |
| Supply Pressure | 32 psig |
| Flow Rate of Erosion Media | 1.6 g/min |
| Erosion Test Standard | Breakthrough Time and Weight Loss |

TABLE 2

| | Example 2 | Example 3 | Example 4A | | Example 4B | Example 4C | | Example 4D |
|---|---|---|---|---|---|---|---|---|
| Experiment No. | 50 | 36 | 37 | | 33 | 42 | | 38 |
| Substrate | AM-350 | AM-350 | AM-350 | Ti/6Al/4V | AM-350 | AM-350 | Ti-6Al/4V | AM-350 |
| Temperature, °C. | 460 | 460 | 460 | | 465 | 460 | | 460 |
| Pressure, Torr | 40 | 40 | 40 | | 40 | 40 | | 40 |
| W Coating Conditions | | | | | | | | |
| $H_2$, SCCM | 3,000 | — | 3,000 | | 3,000 | 3,000 | | 3,000 |
| Ar, SCCM | 4,000 | — | — | | — | — | | — |
| $WF_6$, SCCM | 300 | — | 300 | | 300 | 150 | | 300 |
| Time, Min. | 15 | — | 5 | | 5 | 30 | | 10 |
| Tungsten/Tungsten Carbide Conditions | | | | | | | | |
| $H_2$, SCCM | — | 3,000 | 3,000 | | 3,000 | 3,000 | | 3,000 |
| Ar, SCCM | — | — | — | | — | — | | — |
| $WF_6$, SCCM | — | 300 | 300 | | 300 | 300 | | 300 |
| DME, SCCM | — | 40 | 40 | | 40 | 40 | | 40 |
| Time, Min. | — | 40 | 55 | | 35 | 20 | | 30 |
| Coating Thickness, μm | | | | | | | | |
| Tungsten | 12.0 | — | 3.0 | 2.0 | 3.0 | 5.0 | 3.0 | 8.0 |
| Tungsten/Tungsten Carbide | — | 22.0 | 27.0 | 28.0 | 25.0 | 13.0 | 14.0 | 16.0 |
| Tungsten Coating Thickness / Tungsten/Tungsten Carbide Thickness | — | 0.0 | 0.11 | 0.07 | 0.12 | 0.38 | 0.21 | 0.50 |
| Surface Topography | Rough, No Cracks | Smooth, Many Fine Interconnected Cracks | Smooth, Many Fine Interconnected Cracks | | Smooth, Many Fine Interconnected Cracks | Smooth, Many Fine Interconnected Cracks | | Smooth, Several Fine Interconnected Cracks |

| | Example 4E | Example 4F | | Example 4G | Example 4H | | |
|---|---|---|---|---|---|---|---|
| Experiment No. | 107 | 104 | | 106 | 164 | | |
| Substrate | AM-350 | AM-350 | Ti/6Al/4V | AM-350 | AM-350 | Ti/6Al/4V | IN-718 |
| Temperature, °C. | 460 | 460 | | 460 | 460 | | |
| Pressure, Torr | 40 | 40 | | 40 | 40 | | |
| W Coating Conditions | | | | | | | |
| $H_2$, SCCM | 3,000 | 3,000 | | 3,000 | 3,000 | | |
| Ar, SCCM | 4,500 | 4,500 | | 4,500 | 4,500 | | |
| $WF_6$, SCCM | 300 | 300 | | 300 | 300 | | |
| Time, Min. | 15 | 15 | | 15 | 25 | | |
| Tungsten/Tungsten Carbide Conditions | | | | | | | |
| $H_2$, SCCM | 3,000 | 3,000 | | 3,000 | 3,000 | | |
| Ar, SCCM | 300 | 300 | | 300 | 300 | | |
| $WF_6$, SCCM | 300 | 300 | | 300 | 300 | | |
| DME, SCCM | 30 | 50 | | 40 | 40 | | |
| Time, Min. | 30 | 30 | | 30 | 25 | | |
| Coating Thickness, μm | | | | | | | |
| Tungsten | 8.5 | 9.0 | 8.0 | 9.0 | 16.9 | 17.1 | 16.9 |
| Tungsten/Tungsten Carbide | 12.5 | 11.5 | 11.0 | 11.0 | 14.5 | 13.3 | 11.7 |
| Tungsten Coating Thickness / Tungsten/Tungsten Carbide Thickness | 0.68 | 0.78 | 0.73 | 0.81 | 1.17 | 1.29 | 1.44 |
| Surface Topography | Smooth, A Few Fine Inter-Connected | Smooth, A Few Fine Interconnected Cracks | | Smooth, A Few Fine Interconnected | Smooth, A Few Fine Interconnected Cracks | | |

TABLE 2-continued

| | Cracks | | | Cracks | | | | | |
|---|---|---|---|---|---|---|---|---|---|
| | | Example 4I | | | Example 4J | | | Example 4K | |
| Experiment No. | | 177 | | | 167 | | | 160 | |
| Substrate | AM-350 | Ti/6Al/4V | IN-718 | AM-350 | Ti/6Al/4V | IN-718 | AM-350 | Ti/6Al/4V | IN-718 |
| Temperature, °C. | | 460 | | | 460 | | | 460 | |
| Pressure, Torr | | 40 | | | 40 | | | 40 | |
| W Coating Conditions | | | | | | | | | |
| $H_2$, SCCM | | 2,500 | | | 3,000 | | | 2,500 | |
| Ar, SCCM | | 6,000 | | | 4,500 | | | 6,000 | |
| $WF_6$, SCCM | | 250 | | | 300 | | | 250 | |
| Time, Min. | | 25 | | | 25 | | | 25 | |
| Tungsten/Tungsten Carbide Conditions | | | | | | | | | |
| $H_2$, SCCM | | 3,000 | | | 3,000 | | | 3,000 | |
| Ar, SCCM | | 2,000 | | | 300 | | | 2,000 | |
| $WF_6$, SCCM | | 300 | | | 300 | | | 300 | |
| DME, SCCM | | 40 | | | 40 | | | 40 | |
| Time, Min. | | 35 | | | 20 | | | 15 | |
| Coating Thickness, μm | | | | | | | | | |
| Tungsten | 11.0 | 10.5 | 10.3 | 15.5 | 15.7 | 15.0 | 13.2 | 12.5 | 12.5 |
| Tungsten/Tungsten Carbide | 7.7 | 7.8 | 7.7 | 8.7 | 9.0 | 9.0 | 4.4 | 3.4 | 4.0 |
| Tungsten Coating Thickness | | | | | | | | | |
| Tungsten/Tungsten Carbide Thickness | 1.42 | 1.35 | 1.34 | 1.78 | 1.74 | 1.67 | 3.00 | 3.67 | 3.12 |
| Surface Topography | | Smooth, A Few Fine Interconnected Cracks | | | Smooth, A Few Fine Interconnected Cracks | | | Smooth, No Cracks | |

EXAMPLE FOR TUNGSTEN/TUNGSTEN CARBIDE ($W+W_3C$) COATING

Example 3

In this example, several specimens of AM-350, Ti/6Al/4V and IN-718 were coated simultaneously in a single run. The specimens were heated to a temperature of about 460° C. in the presence of flowing argon and at the reaction temperature a gaseous mixture of 300 cc/min $WF_6$, 3,000 cc/min of hydrogen and 40 cc/min of DME was passed into the furnace over the specimens. The total pressure was maintained at 40 Torr, as shown in Table 2. The deposition was conducted for 40 minutes.

Figure 5:
FIG. 5 is the photomicrograph of the $W+W_3C$ coating without the tungsten interlayer at 1,000 magnification on AM-350 stainless steel showing a network of interconnected cracks.

All the specimens were coated with a bright, smooth, adherent, coherent and uniform coating. The coating thickness on stainless steel specimens was ~22 μm. The coating consisted of a mixture of W and $W_3C$ phases, as determined by x-ray diffraction. It was free of columnar grains. The coating had a smooth surface finish. However, the surface of the coating was heavily cracked, as shown in the FIG. 5. The coating had a hardness of 1788 Vickers, as shown in Table 3. The coating showed poor erosion resistance; the breakthrough time and erosion rate were 36 seconds and 42 seconds/mil, respectively. The weight loss during erosion test was 0.00036 g in 30 seconds. Extensive chipping of the coating was observed during the erosion test. Poor erosion resistance of the coating was probably due to presence of a network of cracks in the coating.

EXAMPLES FOR TUNGSTEN FOLLOWED BY TUNGSTEN/TUNGSTEN CARBIDE ($W+W_3C$) COATING

Example 4A

In this example, a two step coating process was used. Several AM-350, Ti/6Al/4V and IN-718 specimens were heated to a temperature of about 460° C. in the presence of flowing argon and at the reaction temperature a gaseous mixture of 300 cc/min $WF_6$, and 3,000 cc/min of hydrogen was passed into the furnace over the specimens for 5 minutes to coat them with tungsten. After coating specimens with tungsten for 5 minutes, a gaseous mixture of 300 cc/min $WF_6$, 3,000 cc/min hydrogen and 40 cc/min of DME was passed into the furnace for 55 minutes to provide tungsten/tungsten carbide coating. A total pressure was maintained at 40 Torr during tungsten as well as tungsten/tungsten carbide coating steps (see Table 2).

The stainless steel and Ti/6Al/4V specimens were coated with 2–3 μm thick tungsten followed by 27–28 μm thick tungsten/tungsten carbide coating as shown in Table 2. The tungsten/tungsten carbide top coat consisted of a mixture of W and $W_3C$ phases as shown in Table 3. The hardness values of the coating on AM-350 and Ti/6Al/4V are summarized in Table 3. The coating on AM-350 and Ti/6Al/4V showed the presence of a network of cracks. Erosion resistance of the coating was extremely poor, as shown in Table 3. Additionally, extensive chipping of the coating was observed during the erosion test. Poor erosion resistance of the coating was probably due to extensive cracking of the coating.

This example described that providing a very thin interlayer of tungsten did not help in improving erosion resistance of the overall composite coating.

Example 48

The CVD run described in Example 4A was repeated to provide tungsten followed by tungsten/tungsten carbide coatings. The reaction conditions used in tungsten and tungsten/tungsten carbide coating steps are summarized in Table 2.

The stainless steel specimens were coated with 3 μm tungsten followed by 25 μm of tungsten/tungsten carbide. The top coat consisted of a mixture of W and $W_3C$ phases. The coating showed the presence of a network of cracks. Erosion resistance of the coating improved slightly, but it was still extremely poor as shown in Table 3. Additionally, extensive chipping of the coating was observed during the erosion test. Poor erosion resistance was due to the presence of a network of cracks in the coating.

This example described that increasing the ratio of the thickness of the tungsten to the tungsten/tungsten carbide layer helped in improving the erosion resistance of the composite coating.

TABLE 3

| | Example 2 | Example 3 | Example 4A | | Example 4B | Example 4C | | Example 4D | Example 4E |
|---|---|---|---|---|---|---|---|---|---|
| Experiment No. | 50 | 36 | 37 | | 33 | 42 | | 38 | 107 |
| Substrate | AM-350 | AM-350 | AM-350 | Ti/6Al/4V | AM-350 | AM-350 | Ti/6Al/4V | AM-350 | AM-350 |
| Coating Composition | W | W + $W_3C$ | W + $W_3C$ | | W + $W_3C$ | W + $W_3C$ | | W + $W_3C$ | W + $W_3C$ |
| Coating Hardness, Kg/mm$^2$ | | | | | | | | | |
| Tungsten Layer | 455 ± 50 | — | — | | — | — | — | — | — |
| Tungsten/Tungsten Carbide Layer | — | 1788 ± 130 | 2276 ± 103 | 2150 ± 128 | 2333 ± 165 | — | — | 2164 ± 264 | 2395 ± 15 |
| Erosion Resistance | | | | | | | | | |
| Breakthrough Time, Secs | 3 | 36 | 42 | 34 | 68 | 43 | 45 | 89 | 93 |
| Calculated Erosion Rate, secs/mil | 6 | 42 | 40 | 31 | 69 | 84 | 82 | 141 | 188 |
| Weight Loss in 30 seconds, g | — | 0.00036 | — | — | 0.00040 | — | — | 0.00014 | — |

| | Example 4F | | Example 4G | | Example 4H | | Example 4I | | |
|---|---|---|---|---|---|---|---|---|---|
| Experiment No. | 104 | | 106 | | 164 | | | 177 | |
| Substrate | AM-350 | Ti/6Al/4V | AM-350 | AM-350 | Ti/6Al/4V | IN-718 | AM-350 | Ti/6Al/4V | IN-718 |
| Coating Composition | W + $W_3C$ | | W + $W_3C$ | | W + $W_3C$ | | | W + $W_3C$ | |
| Coating Hardness, Kg/mm$^2$ | | | | | | | | | |
| Tungsten Layer | — | — | — | — | — | — | — | — | — |
| Tungsten/Tungsten Carbide Layer | 2361 ± 103 | 2328 ± 203 | 2470 ± 53 | 2424 | 2175 | 2539 | 1930 | 1997 | 1971 |
| Erosion Resistance | | | | | | | | | |
| Breakthrough Time, Secs | 115 | 93 | 95 | 128 | 115 | 109 | 69 | 70 | 70 |
| Calculated Erosion Rate, secs/mil | 255 | 215 | 232 | 224 | 220 | 237 | 227 | 228 | 231 |
| Weight Loss in 30 seconds, g | — | — | — | 0.00012 | — | — | — | — | — |

| | Example 4J | | | Example 4K | | |
|---|---|---|---|---|---|---|
| Experiment No. | | 167 | | | 169 | |
| Substrate | AM-350 | Ti/6Al/4V | IN-718 | AM-350 | Ti/6Al/4V | IN-718 |
| Coating Composition | | W + $W_3C$ | | | W + $W_3C$ | |
| Coating Hardness, Kg/mm$^2$ | | | | | | |
| Tungsten Layer | — | — | — | — | — | — |
| Tungsten/Tungsten Carbide Layer | 2508 | 2516 | 2567 | — | — | — |
| Erosion Resistance | | | | | | |
| Breakthrough Time, Secs | 94 | 93 | 96 | 45 | 34 | 42 |
| Calculated Erosion Rate, secs/mil | 274 | 262 | 271 | 260 | 252 | 266 |
| Weight Loss in 30 seconds, g | — | — | — | 0.00014 | — | — |

Example 4C

The CVD run described in Example 4A was repeated to provide tungsten followed by slightly thinner tungsten/tungsten carbide coatings. The reaction conditions used in tungsten and tungsten/tungsten carbide coating steps are summarized in Table 2.

The thicknesses of the tungsten and the tungsten/-tungsten carbide layers obtained on AM-350 and Ti/-6Al/4V are summarized in Table 2. The top coat of the coating consisted of a mixture of W and $W_3C$ phases. The coating, once again, showed the presence of a network of cracks. However, the crack density was considerably lower than that observed in Examples 3, 4A and 4B. This suggested that the tungsten interlayer was helpful in reducing the crack density. The erosion resistance of the coating was considerably better then that of the coatings obtained in Examples 3, 4A and 4B (see Table 3). The extent of chipping observed during the erosion test also reduced considerably.

This example showed that increasing the ratio of the thickness of the tungsten layer to that of the tungsten/-tungsten carbide layer from ~0.07 to 0.12 in Examples 4A and 4B to ~0.2 to 0.3 in this example unexpectedly reduced cracks in the coating and improved its erosion resistance.

Example 4D

The CVD run described in Example 4A was once again repeated to provide tungsten followed by tungsten/tungsten carbide coating. The reaction conditions used for depositing tungsten and tungsten/tungsten carbide coatings were selected in such a way to provide a ratio of the thickness of the tungsten to the tungsten/-tungsten carbide layers of ~0.5 (see Table 2).

The coating showed the presence of cracks, but the crack density was greatly reduced. The coating, surprisingly, showed superior erosion resistance compared to Examples 3 and 4A to 4C. Furthermore, the composite coating obtained in this example showed significantly lower weight loss in the erosion resistance test than Example 3. The chipping of the coating observed during the erosion test was reduced dramatically as well. This example, therefore, clearly demonstrated the importance of the tungsten interlayer in reducing cracks and improving erosion resistance of the composite coating.

Example 4E

In this example, reaction conditions for coating tungsten followed by tungsten/tungsten carbide were selected in such a way to provide a ratio of the thickness of the tungsten to the tungsten/tungsten carbide layers of ~0.68 (see Table 2).

Figure 6:
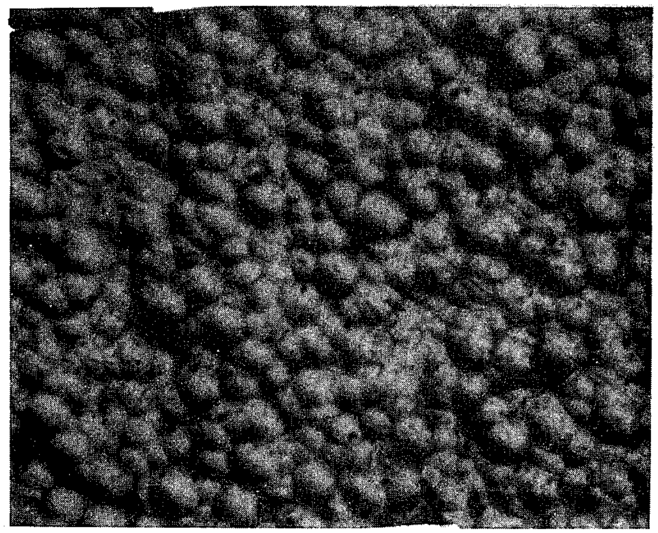
FIG. 6 is the photomicrograph of the $W+W_3C$ coating with the tungsten interlayer at 1,000 magnification on AM-350 stainless steel showing a few interconnected cracks.

The composite coating showed the presence of only a few fine cracks (see FIG. 6). Etched cross section of the coating clearly showed columnar tungsten interlayer followed by non-columnar $W+W_3C$ coating. The composite coating demonstrated superior erosion performance as shown in Table 3.

This example clearly demonstrated the importance of the tungsten interlayer in reducing cracks and improving erosion resistance of the composite coating.

Example 4F

In this example, reaction conditions for coating tungsten followed by tungsten/tungsten carbide were selected in such a way to slightly increase the thickness ratio (see Table 2).

Once again, the coating on AM-350 and Ti/6Al/4V showed presence of a few cracks. Erosion resistance of the composite coating summarized in Table 3 was better than Example 4E. This example also demonstrated the importance of the tungsten interlayer in reducing cracks and improving erosion resistance.

Example 4G

The CVD run described in Example 4F was repeated using reaction conditions summarized in Table 2 to provide slightly higher tungsten to tungsten/tungsten carbide coating thickness ratio.

Once again, the coating showed presence of a few fine cracks. Etched cross section of the coating clearly showed the presence of columnar tungsten interlayer and non-columnar tungsten/tungsten carbide top coat. The erosion resistance of the coating was very similar to that observed in Example 4F.

Example 4H

The CVD run described in Example 4G was repeated using reaction conditions summarized in Table 2 to provide even higher tungsten to tungsten/tungsten carbide coating thickness ratio.

The coating on AM-350, Ti/6Al/4V and IN-718 showed presence of a few cracks. The erosion resistance of the coating was very similar to that noted in Examples 4F and 4G. The weight loss during the erosion test was considerably lower than that observed earlier.

This example, therefore, showed the importance of the tungsten interlayer in reducing the cracks in the coating and in improving the erosion resistance of the coating. It also showed that increasing the thickness of the tungsten interlayer to ~16 $\mu m$ without increasing that of the tungsten/tungsten carbide did not help in further increasing the erosion resistance of the coating.

Example 4I

The CVD run described in Example 4H was repeated to provide even higher tungsten to tungsten/tungsten carbide coating thickness ratio. The higher ratio was obtained by reducing the thickness of the tungsten/-tungsten carbide layer.

The coating showed the presence of a few very fine cracks. The erosion resistance of the composite coating was similar to that noted in Example 4H (see Table 3). This example, once again, showed the importance of the tungsten interlayer in reducing cracks and improving erosion resistance of the composite coating. It also showed that the breakthrough time was dependent on the thickness of the tungsten/tungsten carbide layer; whereas, the erosion rate was independent of it.

Example 4J

The CVD run described in Example 4I was repeated to provide even higher tungsten to tungsten/tungsten carbide coating thickness ratio. The higher ratio was obtained by increasing the thickness of the tungsten interlayer.

The coating, once again, showed presence of a few very fine cracks. The erosion resistance of the composite coating was slightly higher than that noted earlier (see Table 3). This example also showed the importance of the tungsten interlayer.

Example 4K

The CVD run described in Example 4J was repeated to provide even higher tungsten to tungsten/tungsten carbide coating thickness ratio.

Figure 7:
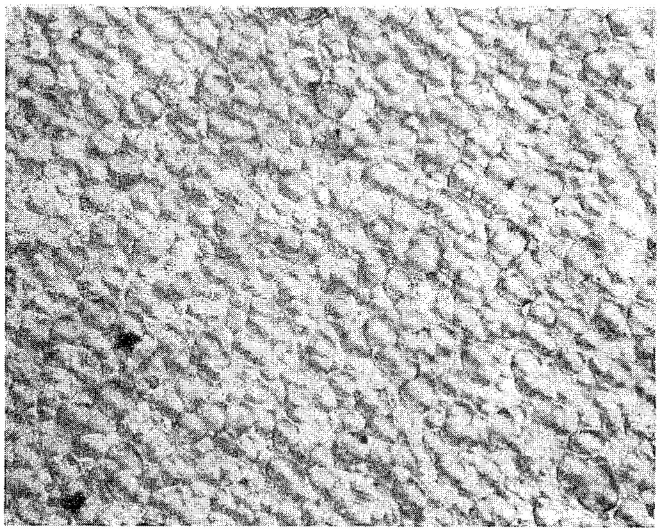
FIG. 7 is the photomicrograph of the $W+W_3C$ coating with the tungsten interlayer at 1,000 magnification on AM-350 stainless steel showing the absence of cracks.

The coating, unexpectedly, was found to be absolutely crack free, as shown in the FIG. 7. The erosion resistance of the coating was comparable to the data noted earlier. Weight loss during erosion test was also comparable to the data noted earlier.

This example demonstrated that a crack-free coating could be obtained by manipulating the ratio of the thickness of the tungsten and the tungsten/tungsten carbide layers. This is an unexpected and significant finding.

Discussion on Tungsten Followed by $W+W_3C$ Coating

Because of extensive cracking, the $W+W_3C$ coating without a W interlayer provided very little erosion protection to the base metal. In this case, erosion occurs preferentially at cracks which causes chipping and flaking of large pieces of the coating. The cracks are believed to occur during the deposition and/or cool-down due to the build up in stresses within the coating. Surprisingly, the cracks in the coating can be minimized or even eliminated by providing a tungsten interlayer. It is believed that the function of the tungsten interlayer is to accommodate stresses that build up in the coating during the deposition and/or cool-down. The ability to accommodate stress may be in part due to the columnar structure of the tungsten layer, since the compliance of this layer is probably very anisotropic. The amount of coating stress which can be accommodated by the tungsten interlayer will depend on its thickness. However, the physical dimensions over which a significant amount of stress accommodation will occur will be limited so that the stresses which are present in the outer layer of a thick tungsten/tungsten carbide coating will be virtually unaffected by the presence of the interlayer. Consequently, both the thickness of the tungsten/tungsten carbide layer and the ratio of the W to the $W+W_3C$ thickness are important in obtaining a crack-free composite coating.

The presence of a tungsten interlayer, in which the thickness of the tungsten interlayer is at least 3 $\mu m$ and the ratio of W to $W+W_3C$ thickness is at least above 0.3, is necessary to increase the erosion resistance of the composite coating. However, the presence of a tungsten interlayer, in which the ratio of W to $W+W_3C$ thickness is at least 0.6, is necessary for the optimum erosion and abrasion wear performance.

Figure 8:
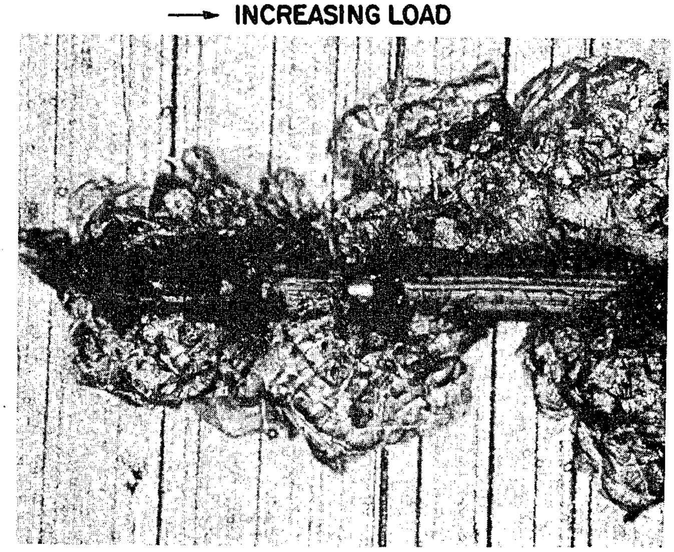
FIG. 8 is the photomicrograph of the surface of $W+W_3C$ coating without the tungsten interlayer on AM-350 stainless steel at 100 magnification, scratched with a diamond stylus and showing significant loss of the coating in the 30–40 Newton load range.
Figure 9:
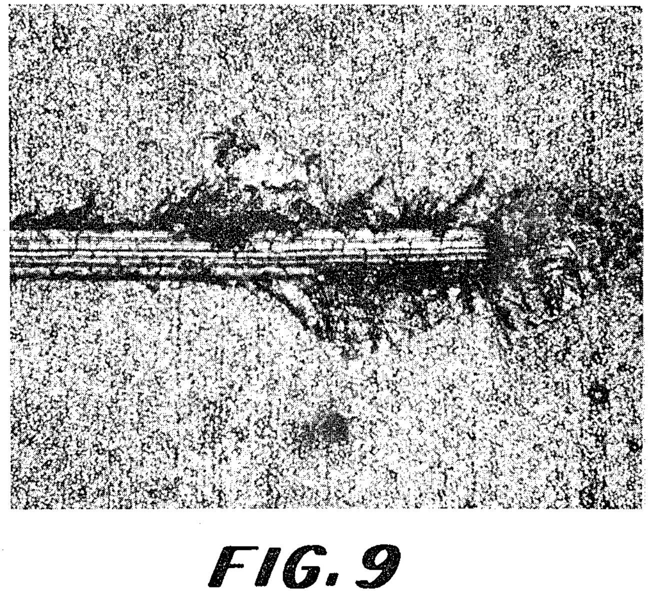
FIG. 9 is the photomicrograph of the surface of $W+W_3C$ coating with the tungsten interlayer on AM-350 stainless steel at 100 magnification, scratched with a diamond stylus and showing significantly reduced loss of the coating in the 30–40 Newton load range.

The tungsten interlayer also effects the performance of the tungsten/tungsten carbide coating in a scratch test. In this test, a diamond stylus is dragged across the surface of the sample at a constantly increasing load. The load at which coating loss begins to occur and the extent of coating loss can generally be correlated to the performance of a coating in the erosive and abrasive wear applications. The tungsten/tungsten carbide coating with no tungsten interlayer as described in Example 3 showed extensive coating loss in the 30–40 Newton load range in the scratch test, as shown in the FIG. 8. When a tungsen interlayer is present as described in Example 4E, the loss of the coating in the same load range is significantly reduced, as demonstrated in the FIG. 9; consequently, the presence of a tungsten interlayer is important for erosive and abrasive wear applications.

Due to the preferential erosive and abrasive wear, which occurs at cracks, a crack-free coating may be highly desirable under certain wear conditions. This conclusion would be especially true in situations where the substrate needs to be completely protected, such as in corrosive-wear environments. A crack-free coating will also be important when a smooth wear surface is required. This crack-free coating was unexpectedly obtained by significantly increasing the ratio of the thickness of the W to the $W+W_3C$ layer. Although Example 4K was produced by depositing a thin layer of $W+W_3C$, in theory, a crack-free coating could also be produced by depositing a very thick tungsten interlayer.

EXAMPLES FOR TUNGSTEN/TUNGSTEN CARBIDE ($W+W_2C+W_3C$) COATING

Example 5A

In this example, several AM-350 specimens were coated in a run. The specimens were heated to a temperature of about 460° C. in the presence of flowing argon gas and at the reaction temperature a gaseous mixture of 300 cc/min $WF_6$, 3,000 cc/min of hydrogen and 55 cc/min of DME was passed into the furnace over the specimens. The total pressure was maintained at 40 Torr, as shown in Table 4. The deposition was conducted for 20 minutes.

Figure 10:
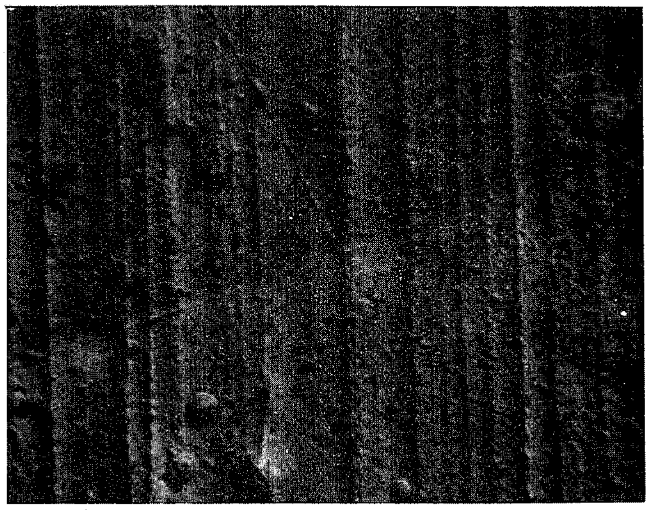
FIG. 10 is the photomicrograph of the $W+W_2C+W_3C$ coating without the tungsten interlayer on AM-350 stainless steel at 1,000 magnification showing a network of cracks.

All the specimens were coated with a bright, smooth, adherent, coherent and uniform coating. The coating thickness was ~7 $\mu m$ (see Table 4). It consisted of a mixture of W, $W_2C$ and $W_3C$ phases, which was considerably different than observed in Example 3. It was free of columnar grains. The micro-structure of the coating consisted of a layered structure. The coating had a smooth surface finish. However, the surface of the coating was cracked, as shown in the FIG. 10. The crack density was surprisingly lower than that observed in Example 3. The coating had a hardness of 2248 Vickers (Table 5). The coating showed poor erosion resistance; the breakthrough time and erosion rate were 21 seconds and 76 seconds/mil. The erosion resistance, however, was much higher than Example 3. The weight loss during erosion test was 0.00042g in 30 seconds, which was very similar to that noted in Example 3. Extensive chipping of the coating was observed during the erosion test. Poor erosion resistance of the coating was probably due to the presence of a network of cracks in the coating.

Example 5B

The CVD run described in Example 5A was repeated with Ti/6Al/4V specimens using reaction conditions described in Table 4. The specimens were coated with a bright, smooth, adherent, coherent and uniform ~9.5 $\mu m$ thick coating. It consisted of a mixture of W, $W_2C$ and $W_3C$ phases. It was free of columnar grains. It had a smooth surface finish. It consisted of a network of cracks on the surface. It showed poor erosion resistance (see Table 5), but the erosion resistance was surprisingly better than the coating on AM-350.

TABLE 4

| | Example 5A | Example 5B | Example 6A | | Example 6B | | Example 6C | |
|---|---|---|---|---|---|---|---|---|
| Experiment No. | 51 | 140 | 70 | | 72 | | 77 | |
| Substrate | AM-350 | Ti/6Al/4V | AM-350 | Ti/6Al/4V | AM-350 | Ti/6Al/4V | AM-350 | Ti/6Al/4V |
| Temperature, °C. | 460 | 460 | 460 | | 465 | | 465 | |
| Pressure, Torr | 40 | 40 | 40 | | 40 | | 40 | |
| W Coating Conditions | | | | | | | | |
| $H_2$, SCCM | — | — | 3,000 | | 3,000 | | 3,000 | |
| Ar, SCCM | — | — | 4,500 | | 4,500 | | 4,500 | |
| $WF_6$, SCCM | — | — | 300 | | 300 | | 300 | |
| Time, Min. | — | — | 3 | | 4.5 | | 10 | |
| Tungsten Carbide Conditions | | | | | | | | |
| $H_2$, SCCM | 3,000 | 3,000 | 3,000 | | 3,000 | | 3,250 | |
| Ar, SCCM | — | 1,800 | — | | — | | — | |
| $WF_6$, SCCM | 300 | 300 | 300 | | 300 | | 300 | |
| DME, SCCM | 55 | 55 | 55 | | 55 | | 60 | |
| Time, Min. | 20 | 35 | 20 | | 20 | | 45 | |
| Coating Thickness, μm | | | | | | | | |
| Tungsten | — | — | 3.0 | 3.4 | 5.0 | 5.0 | 8.0 | 8.0 |
| Tungsten/Tungsten Carbide | 7.0 | 9.5 | 8.4 | 9.0 | 13.0 | 9.5 | 20.0 | 15.0 |
| Tungsten Coating Thickness | | | | | | | | |
| Tungsten/Tungsten Carbide Thickness | — | — | 0.36 | 0.38 | 0.38 | 0.52 | 0.40 | 0.53 |
| Surface Topography | Smooth, Many Interconnected Cracks | Smooth, Many Interconnected Cracks | Smooth, A Few Inter-connected Cracks | | Smooth, A Few Fine Cracks | | Smooth, A Few Cracks | |

| | Example 6D | | Example 6E | | Example 6F | | Example 6G | |
|---|---|---|---|---|---|---|---|---|
| Experiment No. | 53 | | 103 | | 82 | | 111 | |
| Substrate | AM-350 | Ti/6Al/4V | AM-350 | Ti/6Al/4V | AM-350 | Ti/6Al/4V | AM-350 | Ti/6Al/4V |
| Temperature, °C. | 460 | | 460 | | 460 | | 465 | |
| Pressure, Torr | 40 | | 40 | | 40 | | 40 | |
| W Coating Conditions | | | | | | | | |
| $H_2$, SCCM | 3,000 | | 3,000 | | 3,000 | | 3,000 | |
| Ar, SCCM | 4,000 | | 4,500 | | 4,500 | | 4,500 | |
| $WF_6$, SCCM | 300 | | 300 | | 300 | | 300 | |
| Time, Min. | 7 | | 15 | | 10 | | 15 | |
| Tungsten Carbide Conditions | | | | | | | | |
| $H_2$, SCCM | 3,000 | | 3,000 | | 3,500 | | 3,000 | |
| Ar, SCCM | — | | 300 | | — | | 300 | |
| $WF_6$, SCCM | 300 | | 300 | | 350 | | 300 | |
| DME, SCCM | 55 | | 60 | | 65 | | 50 | |
| Time, Min. | 20 | | 40 | | 30 | | 30 | |
| Coating Thickness, μm | | | | | | | | |
| Tungsten | 6.0 | 6.0 | 9.2 | 7.7 | 9.0 | 8.6 | 9.6 | 8.8 |
| Tungsten/Tungsten Carbide | 9.5 | 9.5 | 12.3 | 12.3 | 16.0 | 11.5 | 11.5 | 12.0 |
| Tungsten Coating Thickness | | | | | | | | |
| Tungsten/Tungsten Carbide Thickness | 0.63 | 0.63 | 0.74 | 0.63 | 0.56 | 0.75 | 0.83 | 0.73 |
| Surface Topography | Smooth No Cracks | Smooth, A Few Cracks | Smooth, A Few Fine Cracks | | Smooth, A Few Fine Cracks | | Smooth, A Few Fine Cracks | |

| | Example 6H | Example 6I | Example 6J | Example 6K |
|---|---|---|---|---|
| Experiment No. | 102 | 52 | 56 | 76 |

TABLE 4-continued

| Substrate | AM-350 | Ti/6Al/4V | AM-350 | Ti/6Al/4V | AM-350 | Ti/6Al/4V | AM-350 | Ti/6Al/4V |
|---|---|---|---|---|---|---|---|---|
| Temperature, °C. | 460 | | 460 | | 460 | | 465 | |
| Pressure, Torr | 40 | | 40 | | 40 | | 40 | |
| W Coating Conditions | | | | | | | | |
| $H_2$, SCCM | 3,000 | | 3,000 | | 3,000 | | 3,000 | |
| Ar, SCCM | 4,500 | | 4,000 | | 4,500 | | 4,000 | |
| $WF_6$, SCCM | 300 | | 300 | | 300 | | 300 | |
| Time, Min. | 15 | | 10 | | 10 | | 30 | |
| Tungsten Carbide Conditions | | | | | | | | |
| $H_2$, SCCM | 3,000 | | 3,000 | | 3,000 | | 3,000 | |
| Ar, SCCM | 300 | | — | | — | | — | |
| $WF_6$, SCCM | 300 | | 300 | | 300 | | 300 | |
| DME, SCCM | 60 | | 55 | | 55 | | 55 | |
| Time, Min. | 30 | | 20 | | 15 | | 45 | |
| Coating Thickness, μm | | | | | | | | |
| Tungsten | 10.0 | 8.1 | 8.0 | 7.5 | 7.1 | 7.5 | 19.0 | 16.0 |
| Tungsten/Tungsten Carbide | 8.0 | 8.0 | 10.0 | 7.5 | 6.2 | 6.0 | 11.0 | 9.0 |
| Tungsten Coating Thickness | | | | | | | | |
| Tungsten/Tungsten Carbide Thickness | 1.25 | 1.01 | 0.80 | 1.00 | 1.14 | 1.25 | 1.75 | 1.78 |
| Surface Topography | Smooth, No Cracks | | Smooth, No Cracks | | Smooth, No Cracks | | Smooth, No Cracks | |

TABLE 5

| | Example 5A | Example 5B | Example 6A | | Example 6B | | Example 6C | |
|---|---|---|---|---|---|---|---|---|
| Experiment No. | 51 | 140 | 70 | | 72 | | 77 | |
| Substrate | AM-350 | Ti/6Al/4V | AM-350 | Ti/6Al/4V | AM-350 | Ti/6Al/4V | AM-350 | Ti/6Al/4V |
| Coating Composition | $W + W_2C + W_3C$ | $W + W_2C + W_3C$ | $W + W_2C + W_3C$ | | $W + W_2C + W_3C$ | | $W + W_2C + W_3C$ | |
| Coating Hardness, $Kg/mm^2$ | | | | | | | | |
| Tungsten layer | — | — | — | — | — | — | — | — |
| Tungsten/Tungsten Carbide Layer | 2248 ± 70 | 2191 | 2078 ± 49 | — | 2253 ± 73 | — | 2102 ± 101 | — |
| Erosion Resistance | | | | | | | | |
| Breakthrough Time, secs | 21 | 44 | 104 | 131 | 160 | 147 | 218 | 201 |
| Calculated Erosion Rate, secs/mil | 76 | 117 | 314 | 370 | 313 | 394 | 278 | 340 |
| Weight Loss in 30 seconds, g | 0.00042 | 0.0028 | 0.00012 | 0.00015 | — | — | — | — |

| | Example 6D | | Example 6E | | Example 6F | | Example 6G | |
|---|---|---|---|---|---|---|---|---|
| Experiment No. | 53 | | 103 | | 82 | | 111 | |
| Substrate | AM-350 | Ti/6Al/4V | AM-350 | Ti/6Al/4V | AM-350 | Ti/6Al/4V | AM-350 | Ti/6Al/4V |
| Coating Composition | $W + W_2C + W_3C$ | | $W + W_2C + W_3C$ | | $W + W_2C + W_3C$ | | $W + W_2C + W_3C$ | |
| Coating Hardness, $Kg/mm^2$ | | | | | | | | |
| Tungsten layer | — | — | — | — | — | — | — | — |
| Tungsten/Tungsten Carbide Layer | 2359 ± 114 | 2215 ± 194 | 2224 ± 146 | 2469 ± 53 | 2220 ± 100 | — | 3097 ± 210 | 3156 ± 76 |
| Erosion Resistance | | | | | | | | |
| Breakthrough Time, secs | 119 | — | 158 | 137 | 209 | 128 | 146 | 123 |
| Calculated Erosion Rate, secs/mil | 318 | — | 325 | 283 | 332 | 284 | 322 | 260 |
| Weight Loss in 30 seconds, g | — | — | — | — | — | — | — | — |

| | Example 6H | | Example 6I | | Example 6J | | Example 6K | |
|---|---|---|---|---|---|---|---|---|
| Experiment No. | 102 | | 52 | | 56 | | 76 | |
| Substrate | AM-350 | Ti/6Al/4V | AM-350 | Ti/6Al/4V | AM-350 | Ti/6Al/4V | AM-350 | Ti/6Al/4V |
| Coating Compositon | $W + W_2C + W_3C$ | | $W + W_2C + W_3C$ | | $W + W_2C + W_3C$ | | $W + W_2C + W_3C$ | |
| Coating Hardness, $Kg/mm^2$ | | | | | | | | |
| Tungsten layer | — | — | — | — | — | — | — | — |
| Tungsten/Tungsten Carbide Layer | 2167 ± 23 | 2324 ± 50 | 2091 ± 101 | 2155 ± 20 | 2078 ± 66 | — | — | 2091 ± 98 |
| Erosion Resistance | | | | | | | | |
| Breakthrough Time, secs | 67 | 66 | 125 | 73 | 58 | 91 | 158 | 150 |
| Calculated Erosion Rate, secs/mil | 212 | 208 | 317 | 248 | 237 | 383 | 364 | 423 |
| Weight Loss in 30 seconds, g | — | — | 0.00012 | 0.00014 | — | — | — | — |

Once again, extensive chipping was observed during the erosion test. The poor erosion resistance and chipping observed during the erosion testing were due to the presence of cracks in the coating.

EXAMPLES FOR TUNGSTEN FOLLOWED BY TUNGSTEN/TUNGSTEN CARBIDE ($W+W_2C+W_3C$) COATING

Example 6A

In this example, a two step coating process was used. Several AM-350 and Ti/6Al/4V specimens were heated to a temperature of 460° C. in the presence of flowing argon gas and at the reaction temperature a gaseous mixture of 300 cc/min $WF_6$, 3,000 cc/min of $H_2$, and 4,500 cc/min of argon was passed into the furnace over the specimens for 3 minutes to coat them with tungsten. After coating specimens with tungsten, a gaseous mixture of 300 cc/min of $WF_6$, 3,000 cc/min of hydrogen and 55 cc/min of DME was passed into the furnace for 20 minutes to provide tungsten/tungsten carbide coating. The total pressure was maintained at 40 Torr during tungsten as well as tungsten/tungsten carbide coating (see Table 4).

The specimens were coated with tungsten and tungsten/tungsten carbide coating with thicknesses shown in Table 4. The tungsten/tungsten carbide top coat consisted of a mixture of W, $W_2C$ and $W_3C$ phases as shown in Table 5. The coating on AM-350 and Ti/6Al/4V showed a few interconnected cracks. The erosion resistance of the coating was extremely good, as shown in Table 5. Very little chipping and flaking of the coating was observed during the erosion test. The weight loss during the erosion test was considerably lower than that noted in Examples 5A and 5B.

This example clearly showed that the erosion resistance of the coating improved significantly by providing a tungsten interlayer. This example also showed that a thickness of ~3 μm tungsten and a ratio of the thicknesses of tungsten and tungsten/tungsten carbide layers of ~0.35 are sufficient enough to significantly increase the erosion resistance of the composite coating system. This is an unexpected and significant finding.

Example 6B

The CVD run described in Example 6A was repeated using conditions summarized in Table 4. AM-350 and Ti/6Al/4V specimens were coated with 13 μm and 9.5 μm thick tungsten/tungsten carbide coating, respectively. The ratio of W to tungsten/tungsten carbide coating thicknesses was 0.38 and 0.52 on AM-350 and Ti/6Al/4V, respectively. The coating both on AM-350 and Ti/6Al/4V had a few fine cracks. The coating on AM-350 and Ti/6Al/4V had erosion resistance similar to that noted in Example 6A (see Table 5).

This example clearly showed that the erosion resistance of the coating did not improve by increasing the thickness of W interlayer.

Example 6C

The CVD run described in Example 6B was repeated using conditions summarized in Table 4. The specimens were coated with thicker W and tungsten/tungsten carbide layers. The thickness ratio of W and tungsten/tungsten carbide layers was similar to that noted in Example 6B. The coating both on AM-350 and Ti/6Al/4V had a few wide cracks. The erosion resistance of the coating was similar to that noted in Example 6B.

This example, therefore, showed that the crack width increased with increasing the thickness of the tungsten/tungsten carbide layer. It also showed that the breakthrough time of the coating did increase with increasing the thickness of the tungsten/tungsten carbide layer. However, the erosion rate was unaffected by increasing the thickness of the tungsten/tungsten carbide layer.

Example 6D

The CVD run described in Example 6C was repeated using conditions summarized in Table 4 to provide thinner tungsten and tungsten/tungsten carbide layers. The thickness ratio obtained was ~0.63. The coating on AM-350 was crack-free, whereas it was cracked on Ti/6Al/4V. The erosion resistance of the coating was similar to that noted in Example 6C.

This example showed that a crack-free coating on AM-350 could be obtained by providing 6 μm thick W and 9.5 μm thick tungsten/tungsten carbide layer. This example also showed that the erosion resistance of the composite coating was unaffected provided the thickness of the tungsten layer was greater than 3 μm.

Example 6E

The CVD run described in Example 6D was repeated using conditions summarized in Table 4. The thickness of the two layers and thickness ratio are shown in Table 4. The coating both on AM-350 and Ti/6Al/4V had cracks. The erosion resistance of the coating was similar to that noted in the Examples 6A to 6D.

It is interesting to note that despite higher thickness ratio (~0.74) coating on AM-350 cracked. The coating cracked probably due to the thicker tungsten/tungsten carbide layer.

Examples 6F and 6G

These runs were conducted using conditions described in Table 4. The thickness of tungsten/tungsten carbide layer on AM-350 and Ti/6Al/4V varied from 11.5 to 16 μm. The thickness ratio was varied from 0.56 to 0.83.

The coatings on all the specimens were cracked. The erosion resistance of the coatings was very similar to that noted in Examples 6A to 6E. This example, therefore, showed that the erosion resistance of the coating was independent of the thicknesses of tungsten and tungsten/tungsten carbide layers as long as the thickness of the tungsten layer was greater than 3 μm.

Examples 6H to 6K

A number of CVD experiments were conducted using conditions described in Table 4. The thickness of tungsten/tungsten carbide layer obtained in these experiments varied from 6.0 μm to 11.0 μm. The thickness ratio varied from 0.8 to 1.78. The erosion resistance of the coatings was very similar in all the cases.

Figure 11:
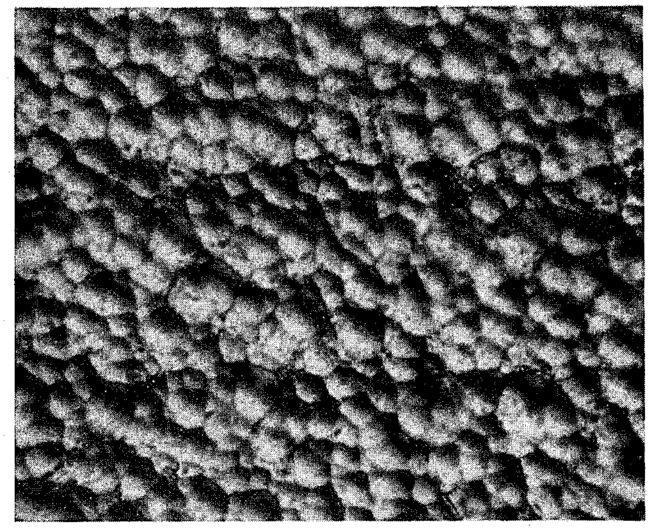
FIG. 11 is the photomicrograph of the $W+W_2C+W_3C$ coating with the tungsten interlayer on AM-350 stainless steel at 1,000 magnification showing the absence of cracks.

Surprisingly, coatings obtained in these examples were crack-free; a photomicrograph of the crack-free coating obtained in Example 6H is shown in the FIG. 11. These examples exhibited columnar structure of W layer and non-columnar structure of tungsten/tungsten carbide layer. The weight loss during the erosion test of coating in Example 6I was very similar to that noted in Example 6A, but it was considerably lower than noted in Examples 5A and 5B. These examples indicated that a crack-free coating could be obtained by limiting the thickness of the tungsten/tungsten carbide layer to ~11.0 μm and maintaining the ratio of the thicknesses of tungsten and tungsten/tungsten carbide to equal or greter than 0.8.

Discussion on Tungsten Followed by $W+W_2C+W_3C$ Coating

As was the case for $W+W_3C$ coating, the erosion resistance of the $W+W_2C+W_3C$ coating was very poor in the absence of a W interlayer, due to extensive cracking within the coating. Once again, cracks within the hard coating can be minimized or even eliminated by the presence of a tungsten interlayer. The tungsten interlayer not only helps to reduce cracks, it also improves the erosion resistance. In this case, a thickness ratio of 0.35 is sufficient for obtaining the optimum erosion resistance. It is an unexpected result that the thickness ratio required to improve the erosion resistance of the $W+W_2C+W_3C$ coating to its maximum value is significantly lower than that for $W+W_3C$. It is also unexpected that the maximum erosion resistance for $W+W_2C+W_3C$ is about 30% greater than for $W+W_3C$; consequently $W+W_2C+W_3C$ is a superior coating for the erosion resistance applications.

As discussed previously, stresses that build up in the tungsten/tungsten carbide coating can be accommodated by the tungsten interlayer so that a crack-free coating can be deposited. Both the ratio of the thicknesses of the W interlayer to the tungsten/tungsten carbide layer and the thickness of the tungsten/tungsten carbide layer are the key parameters for obtaining a crack-free coating. For both AM-350 and Ti/6Al/4V, the maximum thickness of tungsten/tungsten carbide layer for producing a crack-free coating is ~11 μm. The critical thickness ratio for a crack-free coating is 0.6 and 0.8 for AM-350 and Ti/6Al/4V, respectively. Surprisingly, the thickness ratio required for a crack-free $W+W_2C+W_3C$ coating is quite different than the value for $W+W_3C$. Since a crack-free coating is preferable for some applications, as discussed previously, it is important to know the parameters necessary to obtain such a coating.

EXAMPLES FOR TUNGSTEN FOLLOWED BY TUNGSTEN/TUNGSTEN CARBIDE ($W+W_2C$) COATING

Since it was shown earlier that the erosion performance of $W+W_3C$ and $W+W_2C+W_3C$ coatings improved considerably by providing a W interlayer, all the experiments for $W+W_2C$ coating discussed below were conducted with a W interlayer.

Example 7A

In this example, a two step coating process was used. Several AM-350 and Ti/6Al/4V specimens were heated to a temperature of 460° C. in the presence of flowing argon gas and at the reaction temperature a gaseous mixture of 300 cc/min $WF_6$, 3,000 cc/min of $H_2$, and 4,500 cc/min of argon was passed into the furnace over the specimens for 15 minutes to coat them with tungsten. After coating specimens with tungsten, a gaseous mixture of 300 cc/min of $WF_6$, 3,000 cc/min of $H_2$ and 85 cc/min of DME was passed into the furnace for 70 min to provide tungsten/tungsten carbide coating. The total pressure was maintained at 40 Torr during tungsten as well as tungsten/tungsten carbide coating steps (see Table 6).

The specimens were coated with tungsten and tungsten/tungsten carbide of thicknesses ~8 μm and ~23 μm, respectively. These thickness values gave a thickness ratio of ~0.35. The tungsten/tungsten carbide top coat consisted of a mixture of W and $W_2C$ phases, as shown in Table 7. The coating on the specimens showed a few fine cracks. The erosion resistance of the coating was extremely good, as shown in Table 7. No chipping or flaking was observed during the erosion test, which was surprising when compared to $W+W_3C$ and $W+W_2C+W_3C$ coatings.

TABLE 6

| | Example 7A | | Example 7B | | | Example 7C | | |
|---|---|---|---|---|---|---|---|---|
| Experiment No. | 69 | | 121 | | | 115 | | |
| Substrate | AM-350 | Ti/6Al/4V | AM-350 | Ti/6Al/4V | IN-718 | AM-350 | Ti/6Al/4V | IN-718 |
| Temperature, °C. | 460 | | 440 | | | 460 | | |
| Pressure, Torr | 40 | | 40 | | | 40 | | |
| W Coating Conditions | | | | | | | | |
| $H_2$, SCCM | 3,000 | | 2,500 | | | 3,000 | | |
| Ar, SCCM | 4,500 | | 5,500 | | | 4,500 | | |
| $WF_6$, SCCM | 300 | | 250 | | | 300 | | |
| Time, Min. | 15 | | 15 | | | 10 | | |
| Tungsten/Tungsten Carbide Conditions | | | | | | | | |
| $H_2$, SCCM | 3,000 | | 3,000 | | | 3,000 | | |
| Ar, SCCM | — | | 1,800 | | | 300 | | |
| $WF_6$, SCCM | 300 | | 300 | | | 300 | | |
| DME, SCCM | 85 | | 90 | | | 90 | | |
| Time, Min. | 70 | | 115 | | | 40 | | |
| Coating Thickness, μm | | | | | | | | |
| Tungsten | 8.0 | 10.0 | 6.8 | 6.0 | 6.3 | 4.8 | 4.6 | 5.0 |
| Tungsten/Tungsten Carbide | 23.0 | 23.0 | 17.0 | 16.0 | 15.0 | 11.0 | 10.0 | 10.0 |
| Tungsten Coating Thickness / Tungsten/Tungsten Carbide Thickness | 0.35 | 0.43 | 0.40 | 0.37 | 0.42 | 0.44 | 0.46 | 0.50 |
| Surface Topography | Smooth, A few fine Interconnected Cracks | | Smooth, a few fine Cracks | | Smooth, No Cracks | | Smooth, Fine Cracks | Smooth, No Cracks |

| | Example 7D | | Example 7E | | | Example 7F | | Example 7G | |
|---|---|---|---|---|---|---|---|---|---|
| Experiment No. | 95 | | 120 | | | 119 | | 91 | |
| Substrate | AM-350 | Ti/6Al/4V | AM-350 | Ti/6Al/4V | IN-718 | AM-350 | Ti/6Al/4V | AM-350 | Ti/6Al/4V |
| Temperature, °C. | 460 | | 445 | | | 450 | | 460 | |
| Pressure, Torr | 40 | | 40 | | | 40 | | 40 | |
| W Coating Conditions | | | | | | | | | |
| $H_2$, SCCM | 3,000 | | 2,500 | | | 2,500 | | 3,000 | |
| Ar, SCCM | 4,500 | | 5,500 | | | 5,500 | | 4,500 | |

TABLE 6-continued

| | | | | | | | | | |
|---|---|---|---|---|---|---|---|---|---|
| WF$_6$, SCCM | 300 | | 250 | | | 250 | | 300 | |
| Time, Min. | 10 | | 15 | | | 15 | | 10 | |
| Tungsten/Tungsten Carbide Conditions | | | | | | | | | |
| H$_2$, SCCM | 3,000 | | 3,000 | | | 3,000 | | 3,000 | |
| Ar, SCCM | 300 | | 1,800 | | | 1,500 | | 300 | |
| WF$_6$, SCCM | 300 | | 300 | | | 300 | | 300 | |
| DME, SCCM | 90 | | 90 | | | 90 | | 90 | |
| Time, Min. | 50 | | 95 | | | 80 | | 40 | |
| Coating Thickness, $\mu$m | | | | | | | | | |
| Tungsten | 6.6 | 4.4 | 6.8 | 6.2 | 6.4 | 6.8 | 6.8 | 5.6 | 5.0 |
| Tungsten/Tungsten Carbide | 14.8 | 12.0 | 13.0 | 12.7 | 10.6 | 12.4 | 12.8 | 10.0 | 10.0 |
| Tungsten Coating Thickness / Tungsten/Tungsten Carbide Thickness | 0.44 | 0.37 | 0.52 | 0.49 | 0.60 | 0.55 | 0.53 | 0.56 | 0.50 |
| Surface Topography | Smooth, Fine Cracks | | Smooth, No Cracks | | | Smooth, No Cracks | | Smooth, No Cracks | |

| | Example 7H | | Example 7I | | | Example 7J | |
|---|---|---|---|---|---|---|---|
| Experiment No. | 97 | | 122 | | | 68 | |
| Substrate | AM-350 | Ti/6Al/4V | AM-350 | Ti/6Al/4V | IN-718 | AM-350 | Ti/6Al/4V |
| Temperature, °C. | 460 | | 460 | | | 460 | |
| Pressure, Torr | 40 | | 40 | | | 40 | |
| W Coating Conditions | | | | | | | |
| H$_2$, SCCM | 3,000 | | 2,500 | | | 3,000 | |
| Ar, SCCM | 4,500 | | 5,500 | | | 4,500 | |
| WF$_6$, SCCM | 300 | | 250 | | | 300 | |
| Time, Min. | 15 | | 25 | | | 30 | |
| Tungsten/Tungsten Carbide Conditions | | | | | | | |
| H$_2$, SCCM | 3,000 | | 3,000 | | | 3,000 | |
| Ar, SCCM | 300 | | 1,500 | | | — | |
| WF$_6$, SCCM | 300 | | 300 | | | 300 | |
| DME, SCCM | 90 | | 90 | | | 85 | |
| Time, Min. | 50 | | 85 | | | 70 | |
| Coating Thickness, $\mu$m | | | | | | | |
| Tungsten | 9.0 | 7.0 | 12.4 | 12.3 | 12.1 | 25.0 | 23.0 |
| Tungsten/Tungsten Carbide | 15.0 | 11.5 | 19.1 | 18.3 | 17.5 | 27.0 | 26.0 |
| Tungsten Coating Thickness / Tungsten/Tungsten Carbide Thickness | 0.60 | 0.61 | 0.65 | 0.67 | 0.69 | 0.93 | 0.88 |
| Surface Topography | Smooth, Cracks | Smooth, No Cracks | Smooth, Cracks | | | Smooth, Cracks | |

| | Example 7K | | | Example 7L | | Example 7M | | Example 7N | |
|---|---|---|---|---|---|---|---|---|---|
| Experiment No. | 123 | | | 100 | | 101 | | 63 | |
| Substrate | AM-350 | Ti/6Al/4V | IN-718 | AM-350 | Ti/6Al/4V | AM-350 | Ti/6Al/4V | AM-350 | Ti/6Al/4V |
| Temperature, °C. | 460 | | | 460 | | 460 | | 460 | |
| Pressure, Torr | 40 | | | 40 | | 40 | | 40 | |
| W Coating Conditions | | | | | | | | | |
| H$_2$, SCCM | 2,500 | | | 3,000 | | 3,000 | | 3,000 | |
| Ar, SCCM | 5,500 | | | 4,500 | | 4,500 | | 4,500 | |
| WF$_6$, SCCM | 250 | | | 300 | | 300 | | 300 | |
| Time, Min. | 18 | | | 15 | | 15 | | 10 | |
| Tungsten/Tungsten Carbide Conditions | | | | | | | | | |
| H$_2$, SCCM | 3,000 | | | 3,000 | | 3,000 | | 3,000 | |
| Ar, SCCM | 1,800 | | | 300 | | 300 | | 300 | |
| WF$_6$, SCCM | 300 | | | 300 | | 300 | | 300 | |
| DME, SCCM | 90 | | | 80 | | 70 | | 85 | |
| Time, Min. | 65 | | | 40 | | 40 | | 20 | |
| Coating Thickness, $\mu$m | | | | | | | | | |
| Tungsten | 8.8 | 9.0 | 9.2 | 12.0 | 10.4 | 11.2 | 9.2 | 7.5 | 6.7 |
| Tungsten/Tungsten Carbide | 12.7 | 13.1 | 12.3 | 11.6 | 10.4 | 10.0 | 9.2 | 7.7 | 6.5 |
| Tungsten Coating Thickness / Tungsten/Tungsten Carbide Thickness | 0.69 | 0.68 | 0.75 | 1.03 | 1.00 | 1.12 | 1.00 | 0.97 | 1.03 |
| Surface Topography | Smooth, No Cracks | | | Smooth, No Cracks | | Smooth, No Cracks | | Smooth, No Cracks | |

| | Example 70 | | Example 7P | |
|---|---|---|---|---|
| Experiment No. | 65 | | 90 | |
| Substrate | AM-350 | Ti/6Al/4V | AM-350 | Ti/6Al/4V |
| Temperature, °C. | 460 | | 460 | |
| Pressure, Torr | 40 | | 40 | |
| W Coating Conditions | | | | |
| H$_2$, SCCM | 3,000 | | 3,000 | |
| Ar, SCCM | 4,500 | | 4,500 | |
| WF$_6$, SCCM | 300 | | 300 | |
| Time, Min. | 5 | | 10 | |
| Tungsten/Tungsten Carbide Conditions | | | | |
| H$_2$, SCCM | 3,000 | | 3,000 | |
| Ar, SCCM | 300 | | 300 | |

TABLE 6-continued

| | | | | |
|---|---|---|---|---|
| $WF_6$, SCCM | 300 | | 300 | |
| DME, SCCM | 90 | | 90 | |
| Time, Min. | 20 | | 30 | |
| Coating Thickness, $\mu m$ | | | | |
| Tungsten | 4.0 | 4.0 | 5.6 | 5.2 |
| Tungsten/Tungsten Carbide | 6.2 | 5.9 | 7.6 | 7.4 |
| Tungsten Coating Thickness / Tungsten/Tungsten Carbide Thickness | 0.64 | 0.68 | 0.74 | 0.70 |
| Surface Topography | Smooth, No Cracks | | Smooth, No Cracks | |

TABLE 7

| | Example 7A | | Example 7B | | | Example 7C | | | Example 7D | |
|---|---|---|---|---|---|---|---|---|---|---|
| Experiment No. | 69 | | 121 | | | 115 | | | 95 | |
| Substrate | AM-350 | Ti/6Al/4V | AM-350 | Ti/6Al/4V | IN-718 | AM-350 | Ti/6Al/4V | IN-718 | AM-350 | Ti/6Al/4V |
| Coating Composition | | $W + W_2C$ | | $W + W_2C$ | | | $W + W_2C$ | | | $W + W_2C$ |
| Coating Hardness, $Kg/mm^2$ | | | | | | | | | | |
| Tungsten Layer | — | — | — | — | — | — | — | — | — | — |
| Tungsten/Tungsten Carbide Layer | 3060 ± 230 | 2792 ± 60 | 2470 ± 53 | 2432 ± 53 | 2588 ± 57 | 2850 ± 66 | 2947 ± 71 | — | 2991 ± 63 | 3106 ± 148 |
| Erosion Resistance | | | | | | | | | | |
| Breakthrough Time, secs | — | 304 | 201 | 214 | 183 | 135 | 126 | 116 | 203 | 149 |
| Calculate Erosion Rate, secs/mil | — | 336 | 300 | 339 | 310 | 312 | 319 | 295 | 349 | 311 |
| Weight Loss in 30 Seconds, g | — | — | 0.00018 | 0.00020 | 0.00024 | — | — | — | — | — |

| | Example 7E | | | Example 7F | | Example 7G | | Example 7H | |
|---|---|---|---|---|---|---|---|---|---|
| Experiment No. | 120 | | | 119 | | 91 | | 97 | |
| Substrate | AM-350 | Ti/6Al/4V | IN-718 | AM-350 | Ti/6Al/4V | AM-350 | Ti/6Al/4V | AM-350 | Ti/6Al/4V |
| Coating Composition | | $W + W_2C$ | | | $W + W_2C$ | | $W + W_2C$ | | $W + W_2C$ |
| Coating Hardness, $Kg/mm^2$ | | | | | | | | | |
| Tungsten Layer | — | — | — | — | — | — | — | — | — |
| Tungsten/Tungsten Carbide Layer | 2628 ± 15 | 2507 ± 20 | 2402 ± 160 | 2469 ± 53 | 2395 ± 15 | 3089 ± 89 | 2767 ± 188 | 2908 ± 213 | 2758 ± 15 |
| Erosion Resistance | | | | | | | | | |
| Breakthrough Time, secs | 132 | 135 | 112 | 165 | 154 | 124 | 113 | 182 | 150 |
| Calculate Erosion Rate, secs/mil | 258 | 270 | 284 | 325 | 306 | 315 | 288 | 308 | 331 |
| Weight Loss in 30 Seconds, g | — | — | — | — | — | — | — | — | — |

| | Example 7I | | | Example 7J | | Example 7K | | |
|---|---|---|---|---|---|---|---|---|
| Experiment No. | 122 | | | 68 | | 123 | | |
| Substrate | AM-350 | Ti/6Al/4V | IN-718 | AM-350 | Ti/6Al/4V | AM-350 | Ti/6Al/4V | IN-718 |
| Coating Composition | | $W + W_2C$ | | | $W + W_2C$ | | $W + W_2C$ | |
| Coating Hardness, $Kg/mm^2$ | | | | | | | | |
| Tungsten Layer | — | — | — | | | | | |
| Tungsten/Tungsten Carbide Layer | 2472 ± 110 | 2507 ± 15 | 2432 ± 53 | 2758 ± 31 | 2689 ± 159 | 2398 ± 109 | 2324 ± 50 | 2511 ± 116 |
| Erosion Resistance | | | | | | | | |
| Breakthrough Time, secs | 259 | 234 | 248 | 356 | 325 | 162 | 172 | 143 |
| Calculate Erosion Rate, secs/mil | 345 | 325 | 361 | 335 | 318 | 325 | 328 | 295 |
| Weight Loss in 30 Seconds, g | — | — | — | — | — | 0.00016 | 0.00018 | 0.00014 |

| | Example 7L | | Example 7M | | Example 7N | | Example 70 | | Example 7P | |
|---|---|---|---|---|---|---|---|---|---|---|
| Experiment No. | 100 | | 101 | | 63 | | 65 | | 90 | |
| Substrate | AM-350 | Ti/6Al/4V | AM-350 | Ti/6Al/4V | AM-350 | Ti/6Al/AV | AM-350 | Ti/6Al/4V | AM-350 | Ti/6Al/4V |
| Coating Composition | | $W + W_2C$ | | $W + W_2C$ | | $W + W_2C$ | | $W + W_2C$ | | $W + W_2C$ |
| Coating Hardness, $Kg/mm^2$ | | | | | | | | | | |
| Tungsten Layer | — | — | — | — | — | — | — | — | — | — |
| Tungsten/Tungsten Carbide Layer | 2758 ± 15 | 2758 ± 15 | 2434 ± 102 | 2510 ± 95 | 2746 ± 51 | — | 2758 ± 50 | — | 2660 ± 30 | 2716 ± 163 |
| Erosion Resistance | | | | | | | | | | |
| Breakthrough Time, secs | 144 | 120 | 125 | 125 | — | 65 | 54 | 65 | 92 | 73 |
| Calculate Erosion Rate, secs/mil | 316 | 293 | 317 | 345 | — | 254 | 221 | 280 | 307 | 250 |
| Weight Loss in 30 Seconds, g | — | — | — | — | — | — | — | — | — | — |

This example showed that the erosion resistance of $W+W_2C$ coating with a W interlayer was much better than that of $W+W_3C$ and $W+W_2C+W_3C$ coatings with a W interlayer. This is an unexpected and significant finding.

Example 7B

Figure 12:
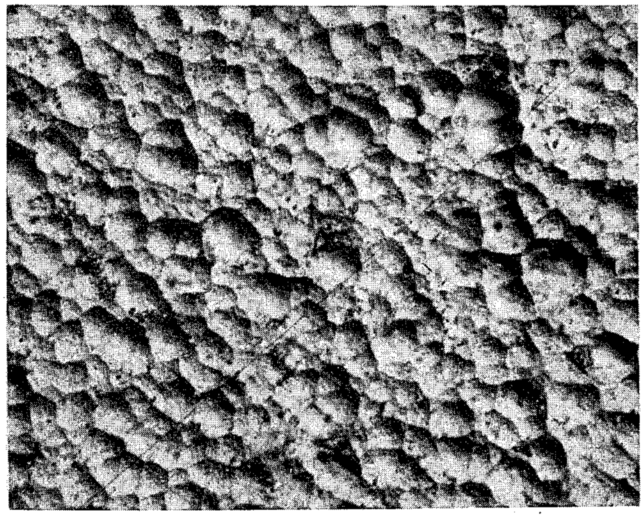
FIG. 12 is the photomicrograph of the $W+W_2C$ coating with the tungsten interlayer on AM-350 stainless steel at 1,000 magnification showing the presence of a fine crack.

In this example, several AM-350, Ti/6Al/4V and IN-718 specimens were coated with W followed by $W+W_2C$ coating using conditions summarized in Table 6. All the specimens were coated with ~6 μm and ~15 μm W and $W+W_2C$ layers, respectively. The coating consisted of columnar W coating and non-columnar $W+W_2C$ coating at the top of W. The thickness ratio was ~0.4. The coating was smooth. However, a few fine cracks were noted in the coating, as shown in the FIG. 12. The erosion resistance of the coating shown in Table 7 was similar to that noted in Example 7A. The weight loss during erosion test was determined and presented in Table 7. The weight loss was slightly higher in this example than that observed with $W+W_2C+W_3C$ coating with W interlayer. This could be related to the fact the cracks in $W+W_2C$ coatings were slightly wider than those noted in $W+W_2C+W_3C$ coating.

Examples 7A and 7B clearly showed that a tungsten to tungsten/tungsten carbide thickness ratio of ~0.35 is sufficient enough to give a maximum erosion resistance.

Example 7C

The CVD run described in Example 7B was repeated to provide slightly higher thickness ratio. The thickness of $W+W_2C$ layer varied from 10 μm to 11 μm on various substrates, and the ratio varied from 0.44 to 0.50. The coating on AM-350 and IN-718 was crack-free; whereas, a few fine cracks were observed on Ti/6Al/4V. This indicated that crack-free coating on AM-350 and IN-718 can be obtained by providing ~5 μm thick W and ~10 to 11 μm thick $W+W_2C$ layers. These thickness values, however, were not good enough to give crack-free coating on Ti/6Al/4V. The erosion resistence of the coating was very good as shown in Table 7.

Example 7D

The CVD run described in Example 7C was repeated to provide slightly thicker $W+W_2C$ layer while maintaining thickness ratio. Surprisingly, the coating on AM-350 and Ti/6Al/4V cracked. This information suggested that the thickness of $W+W_2C$ layer was important to prevent cracks in the coating. The erosion resistance of the coating was good, as shown in Table 7.

Example 7E

Figure 3:
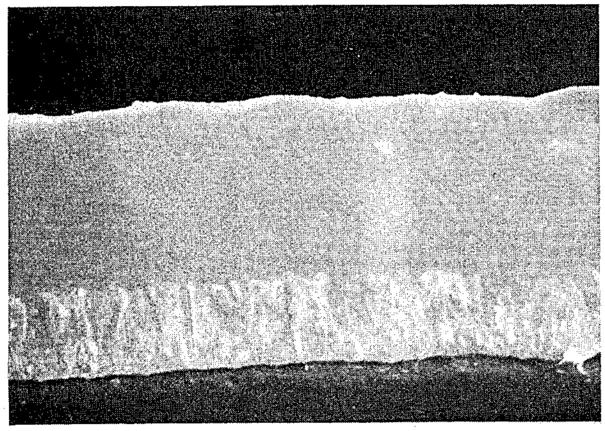
FIG. 3 is the schematic of the unetched cross-sectional view at 2,000 magnification of the composite coating system on AM-350 stainless steel substrate constructed in accordance with the invention.
Figure 4:
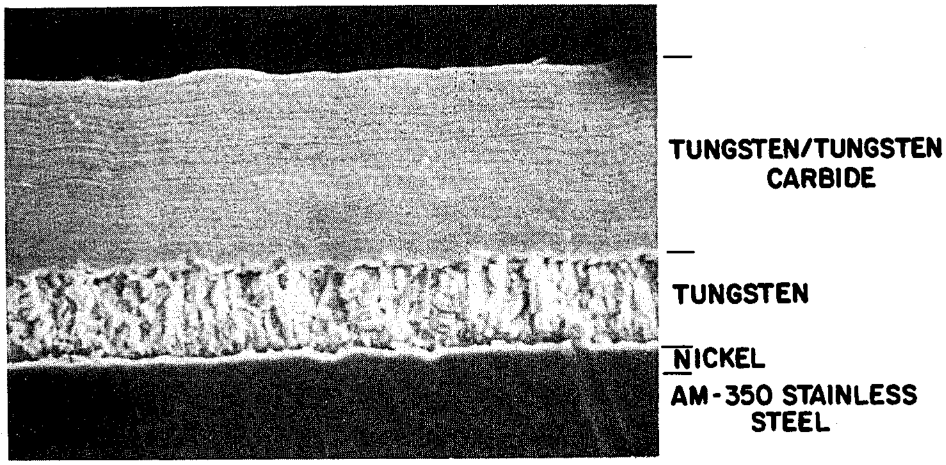
FIG. 4 is the schematic of the cross-sectional view at 2,000 magnification of the composite coating system on AM-350 stainless steel etched with the murakami solution constructed in accordance with the invention.
Figure 13:
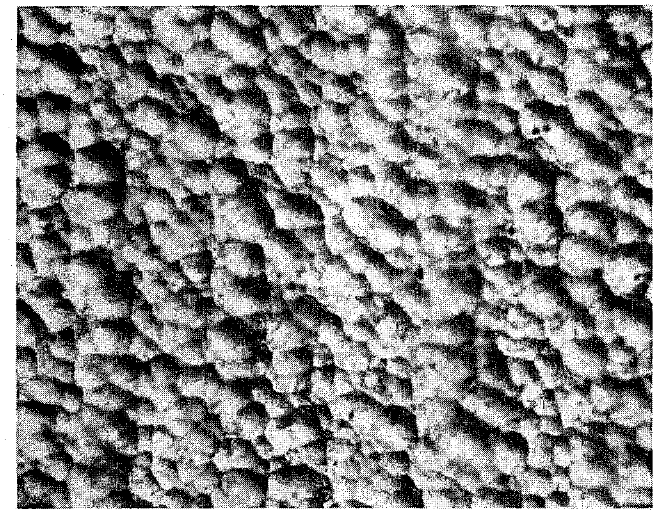
FIG. 13 is the photomicrograph of the $W+W_2C$ coating with the tungsten interlayer on AM-350 stainless steel at 1,000 magnification showing the absence of cracks.

The CVD run described in Example 7D was repeated to provide slightly thinner $W+W_2C$ layer and slightly higher thickness ratio. The coating on AM-350, Ti/6Al/4V and IN-718 was absolutely crack-free (see FIG. 13), certifying the importance of the thickness of $W+W_2C$. The unetched and etched cross-sectional views of the composite coatings are shown in the FIGS. 3 and 4. The etched cross-section presented in the FIG. 4 showed columnar growth of the tungsten interlayer and the non-columnar growth of the tungsten/tungsten carbide layer. The etched cross-section of the coating also demonstrated the absence of any cracks in the coating. The erosion resistance of the coating was good, as shown in Table 7.

Examples 7F and 7G

The CVD run described in Example 7E was repeated in these examples to verify the concept of crack-free coating. The coatings obtained in these runs were absolutely crack-free. They also had good erosion resistance, as shown in Table 7.

Example 7H

In this example, the thickness of W and $W+W_2C$ layers was slightly increased on AM-350 stainless steel to determine its effect on cracks. The thickness ratio obtained was ~0.6. The coating on AM-350 cracked and that on Ti/6Al/4V did not. The coating on AM-350 cracked probably because of the thicker $W+W_2C$ layer. This information further confirmed the statement made earlier that the thickness of $W+W_2C$ layer played an important role in obtaining crack-free coating. Erosion resistance of the coating was good, as shown in Table 7.

Example 7I

To further demonstrate the effect of $W+W_2C$ coating thickness on cracks, a CVD run was carried out to obtain a thicker $W+W_2C$ coating and a higher thickness ratio. Despite higher thickness ratio the coating on all the specimens cracked. This example, therefore, confirmed the importance of the thickness of $W+W_2C$ layer for preventing cracks in the coating. The erosion resistance of the coating was good, as expected.

Example 7J

To further demonstrate the effect of $W+W_2C$ coating thickness on cracks, one more CVD run was conducted to obtain thicker $W+W_2C$ coating and higher thickness ratio. Once again, coating cracked. The erosion resistance of the coating, however, was still good.

Examples 7K to 7P

Several CVD runs were conducted to vary thicknesses of W and $W+W_2C$ layers and thickness ratios. These experiments were conducted to effectively map out the crack-free and cracked coating region. The data summarized in Table 6 showed that as long as the thickness of $W+W_2C$ layer was maintained below ~13.5 μm and thickness ratio maintained above 0.6 the coating obtained was absolutely crack-free. The coating in all the cases demonstrated good erosion resistance, as shown in Table 7.

Discussion on Tungsten Followed by $W+W_2C$ Coating

The erosion resistance of the $W+W_2C$ coating is either equivalent to or superior to the erosion resistance of $W+W_2C+W_3C$. The erosion resistance of $W+W_2C$ is independent of the thickness of the tungsten interlayer when the ratio of the W to the $W+W_2C$ thickness is at least 0.35.

Careful control of both the thickness of the tungsten/tungsten carbide coating and the ratio of the thicknesses of W to $W+W_2C$ is required to obtain a crack-free coating. For both AM-350 and Ti/6Al/4V, the maximum thickness for producing a crack-free coating is about 14 μm. The critical thickness ratio for a crack-free coating is about 0.4 and 0.5 for AM-350 and Ti/6Al/4V, respectively.

Example 8

The wear performance of the uncoated stainless steel 1" diameter SS-422 disc was determined using a ball-on-disc test in the presence and absence of a lubricant. The non-lubricated wear test was conducted in dry air (1% relative humidity) and saturated air (99% relative humidity). The lubricated wear test was conducted in the presence of a cutting fluid consisting of an emulsion of 20% mineral oil in water. The ball used in the test was made of 52-100 chrome steel. The ball-on-disc wear test was performed using a load of 5 Newton, ambient temperature, stationary ball on rotating disc at a speed of 10 cm/sec., and for approximately 0.3 kilometer. The wear performance was determined by measuring the combined volumetric material loss of the ball and disc. The wear rate was very high in the dry air (1% relative humidity), as shown in the Table 8. The wear rate in the saturated air (99% relative humidity) and cutting fluid, on the other hand, was considerably lower, with the rate being lowest in the presence of the lubricant.

Example 9

In this example, a two-step coating process was used. Several SS-422 discs were heated to a temperature of bout 460° C. in the presence of flowing argon and at the reaction temperature a gaseous mixture of 300 cc/min $WF_6$, 3,000 cc/min hydrogen, and 4,500 cc/min of argon was passed into the furnace over the specimens for 15 minutes to coat them with tungsten. After coating the specimens with tungsten for 15 minutes, a gaseous mixture of 300 cc/min $WF_6$, 3,000 cc/min hydrogen, 300 cc/min argon and 40 cc/min of DME was passed into the furnace for 30 minutes to provide tungsten/-tungsten carbide coating. A total pressure was maintained at 40 Torr during the tungsten as well as tungsten/tungsten carbide coating steps.

The SS-422 discs were coated with 10.4 μm thick tungsten followed by 12.4 μm thick tungsten/tungsten carbide. The tungsten/tungsten carbide top coat consisted of a mixture of W and $W_3C$ phases. The hardness of the top coat was approximately 2450 Vickers. The coating was smooth and had a few very fine interconnected cracks.

The wear performance of the coated SS-422 disc was determined using ball-on-disc test described in the Example 8 in the presence of 1% and 99% relative humidity and cutting fluid as a lubricant. The wear rate data summarized in the Table 8 showed dramatically lower wear rate in the presence of dry air (1% relative humidity) compared to the uncoated disc. The wear rate in the presence of 99% relative humidity and cutting fluid was also lower than the uncoated disc.

This example, therefore, shows that a composite coating is very effective in reducing the total wear rate in the presence and absence of a lubricant.

Example 10

In this example, a two-step coating process was used again. Several SS-422 discs were heated to a temperature of about 460° C. in the presence of flowing argon and at the reaction temperature a gaseous mixture of 300 cc/min $WF_6$, 3,000 cc/min hydrogen, and 4,500 cc/min of argon was passed into the furnace over the specimens for 15 minutes to coat them with tungsten. After coating the specimens with tungsten for 15 minutes, a gaseous mixture of 300 cc/min $WF_6$, 3,000 cc/min hydrogen, 300 cc/min argon and 60 cc/min of DME was passed into the furnace for 40 minutes to provide tungsten/tungsten carbide coating. A total pressure was maintained at 40 Torr during the tungsten as well as tungsten/tungsten carbide coating steps.

The SS-422 discs were coated with 9.7 μm thick tungsten followed by 14.0 μm thick tungsten/tungsten carbide. The tungsten/tungsten carbide top coat consisted of a mixture of W, $W_2C$ and $W_3C$ phases. It had a hardness of approximately 2250 Vickers. The coating was smooth and had a few extremely fine and long cracks.

TABLE 8

| Example No. | Composition of the Tungsten/Tungsten Carbide Top Coat | Total Wear Rate, $10^{-15}m^2/N$ 1% Humidity | 99% Humidity | Cutting Fluid |
|---|---|---|---|---|
| Example 8 | — | 327 | 8.1 | 2.9 |
| Example 9 | W + $W_3C$ | 1.9 | 7.7 | 1.0 |
| Example 10 | W + $W_2C$ + $W_3C$ | 1.0 | 4.7 | 0.9 |
| Example 11 | W + $W_2C$ | 1.40 | 3.6 | 1.0 |

The wear performance of the coated SS-422 disc ws determined using ball-on-disc test described in the Example 8 in the presence of 1% and 99% relative humidity and cutting fluid as a lubricant. The wear rate data summarized in the Table 8 showed lower wear rate in the presence of 1% and 99% relative humidity and cutting fluid compared to the uncoated disc and disc coated with tungsten followed by W+$W_3C$ coating.

This example shows that a composite coating is very effective in improving wear performance of the SS-422 disc. It also shows that the wear performance of the composite coating can be improved by adjusting the composition of the tungsten/tungsten carbide top coat.

Example 11

In this example, a two-step coating process was used again. Several SS-422 discs were heated to a temperature of about 460° C. in the presence of flowing argon and at the reaction temperature a gaseous mixture of 300 cc/min $WF_6$, 3,000 cc/min hydrogen, and 4,500 cc/min of argon was passed into the furnace over the specimens for 15 minutes to coat them with tungsten. After coating the specimens with tungsten for 15 minutes, a gaseous mixture of 300 cc/min $WF_6$, 3,000 cc/min hydrogen, 300 cc/min argon and 80 cc/min of DME was passed into the furnace for 40 minutes to provide tungsten/tungsten carbide coating. A total pressure was maintained at 40 Torr during the tungsten as well as tungsten/tugnsten carbide coating steps.

The SS-422 discs were coated with 10 μm thick tungsten followed by 13.0 μm thick tungsten/tungsten carbide. The tungsten/tungsten carbide top coat consisted of a mixture of W and $W_2C$ phases. It had a hardness of approximately 2750 Vickers. The coating was smooth and crack-free.

The wear performance of the coated SS-422 disc was determined using ball-on-disc test described in Example 8 in the presence of 1% and 99% relative humidity and cutting fluid as a lubricant. The wear rate data summarized in Table 8 showed the wear rate was similar to that noted with the other composite coatings (i.e., $W+W_3C$ and $W+W_2C+W_3C$ coatings) in the presence of dry air (1% relative humidity) and cutting fluid. The wear rate, however, was lower compared to other composite coatings in the presence of 99% relative humidity.

This example shows that a composite coating is very effective in improving wear performance of the SS-422 disc.

General Discussion

The wear data presented in Examples 8 to 11 clearly demonstrate that a composite tungsten followed by tungsten/tungsten carbide coating can be used to significantly reduce the abrasive wear rate and concomitantly increase the life of the stainless steel material in the dry, humid and lubricated environments. The data presented in Examples 1 to 4 show that the composite coating is very effective in reducing the erosive wear rate of the ferrous and non-ferrous alloys. Additionally, Examples 1 to 4 show that an interlayer of tungsten is required to improve the performance of the tungsten/tungsten carbide coating. This is an unexpected finding.

Figure 14:
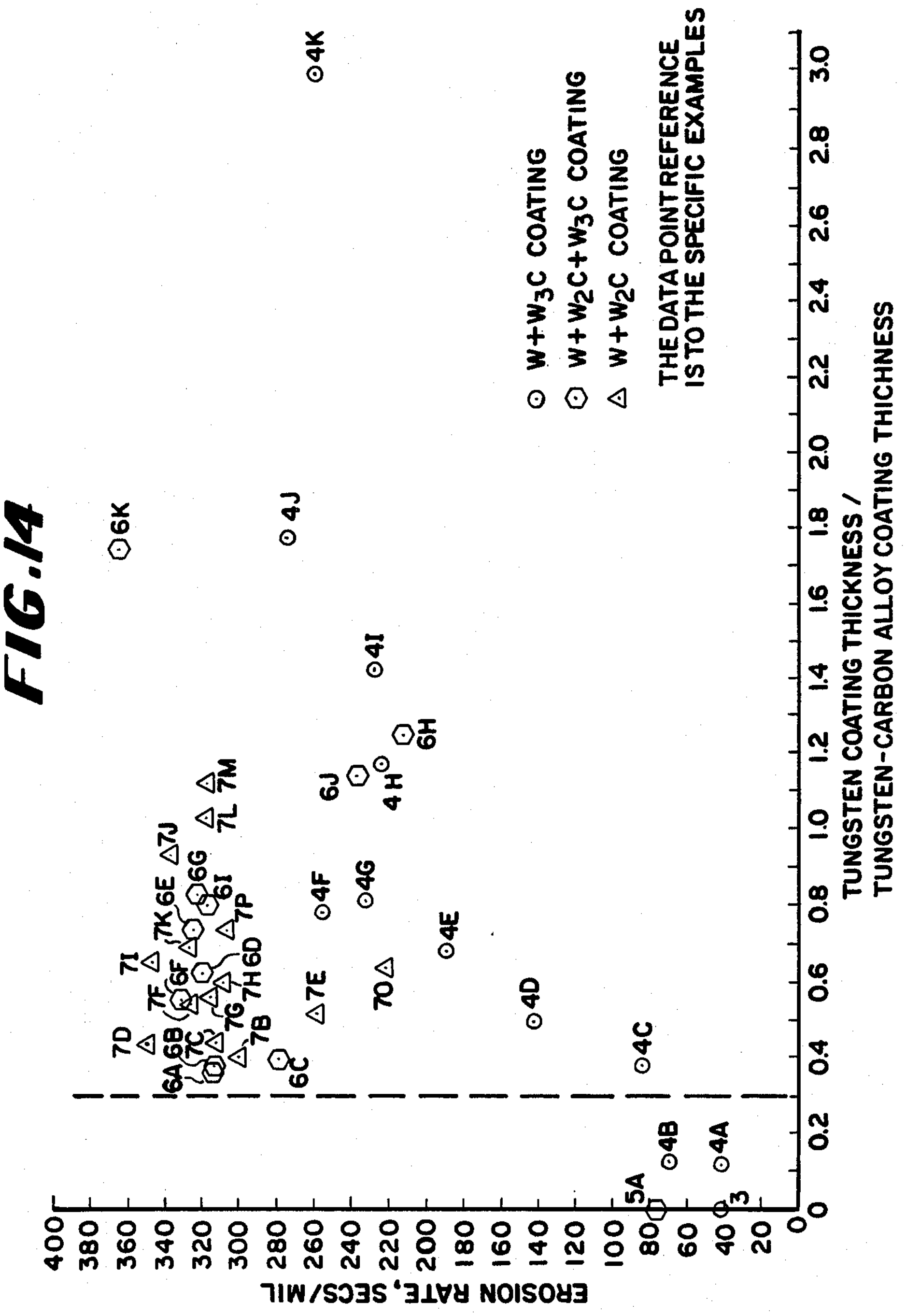
FIG. 14 is the graph illustrating the relationship between the erosion rate and the ratio of the tungsten to the tungsten/carbon alloy coating thicknesses on AM-350 stainless steel.

The relationship between the ratio of the thickness of the tungsten interlayer to the thickness of the tungsten-carbon alloy (tungsten/tungsten carbide coating) is elaborated further in the FIG. 14. It shows that for $W+W_3C$ top coat the erosion resistance measured as secs/mil increases with increasing the thickness ratio. A thickness ratio greater than 0.3 is required to significantly increase the erosion resistance of the $W+W_3C$ coating system. Furthermore, a thickness ratio of about 0.6 is required to obtain optimum erosion resistance of the $W+W_3C$ coating system. FIG. 14 also shows that a thickness ratio of greater than 0.3 is required for significantly increasing the erosion resistance of the $W+W_2C+W_3C$ coating system. It also shows that a thickness ratio of about 0.35 yields optimum erosion performance both for the $W+W_2C+W_3C$ and $W+W_2C$ coating systems. This thickness ratio to obtain optimum erosion resistance is considerably lower for the $W+W_2C+W_3C$ and $W+W_2C$ coating systems than the $W+W_3C$ coating system.

Figure 15:
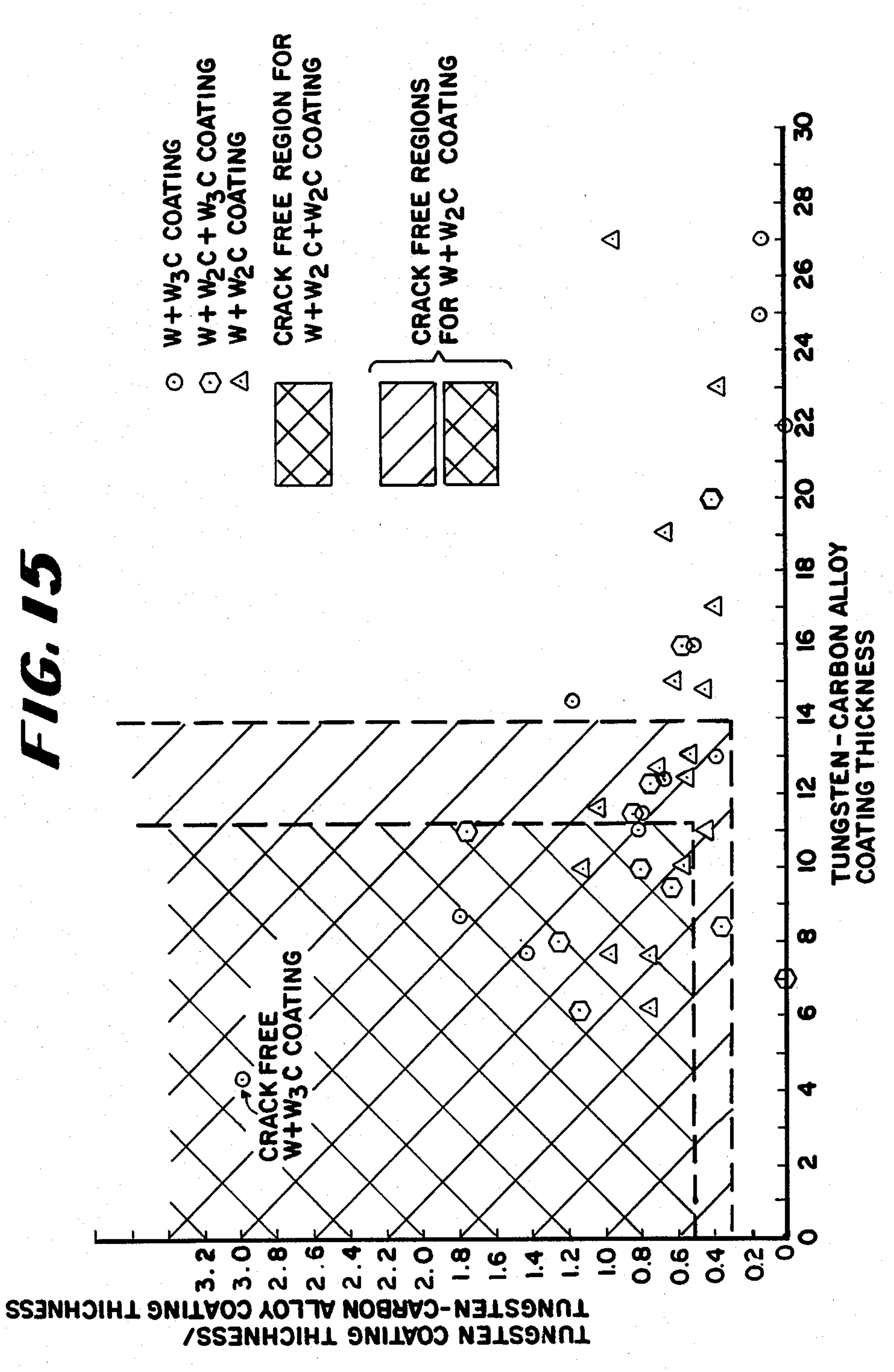
FIG. 15 is the graph illustrating the relationship between the tungsten/carbon alloy coating thickness and the ratio of the thicknesses of the tungsten layer to the tungsten/carbon alloy layer on AM-350 stainless steel.

The relationship between the thickness of the tungsten-carbon alloy and the ratio of the thickness of the tungsten interlayer to the thickness of the tungsten-carbon alloy (tungsten/tungsten carbide coating) is presented in FIG. 15. It shows a very narrow region for obtaining a crack-free $W+W_3C$ coating system. A thin $W+W_3C$ layer is required to achieve a crack-free coating. Compared to the $W+W_3C$ coating system, the $W+W_2C+W_3C$ and $W+W_2C$ coating systems provide a wider crack-free coating region.

It is worth noting that a thicker crack-free tungsten/-tungsten carbide coating can be obtained for $W+W_2C$ top coat than is possible for $W+W_2C+W_3C$ or for $W+W_3C$. In addition, the thickness of the tungsten interlayer which is required to achieve a crack-free coating is significantly lower for $W+W_2C$ than for $W+W_2C+W_3C$ or $W+W_3C$. By reducing the thickness of the W interlayer, the overall thickness of the composite coating which is required to provide a specified erosive wear life or abrasive wear life can be minimized by going progressively from $W+W_3C$ to $W+W_2C+W_3C$ and to $W+W_2C$ composite coating system.

One particularly important use of the composite coating system according to the present invention is to provide highly erosive and abrasive wear resistant coatings on ferrous, non-ferrous and titanium alloy compressor blades for gas turbines and jet engines.

What is claimed is:

1. A highly erosion and abrasion wear resistant composite coating system comprising a substrate an intermediate layer on said substrate of tungsten of sufficient thickness to confer substantial erosion and abrasion wear resistant characteristics on said coating system, and an outer layer of a mixture of tungsten and tungsten carbide wherein said tungsten carbide is selected from the group consisting of $W_2C$, $W_3C$, or a mixture of both, and wherein the ratio of the thickness of the tungsten intermediate layer to the thickness of the outer layer is at least above 0.30.

2. A composite coating system according to claim 1 wherein said intermediate layer is at least two microns thick.

3. A composite coating system according to claim 1 wherein said intermediate layer has a substantially columnar grain structure.

4. A composite coating system according to claim 1 wherein said outer layer has a substantially fine-grained, non-columnar and lamellar structure.

5. A composite coating system according to claim 1 including a primary layer on the opposite side of said tungsten intermediate layer from said outer layer, said primary layer being comprised substantially of an inert metal selected from the group consisting of cobalt, rhodium, iridium, nickel, palladium, platinum, copper, silver and gold, alloys thereof and mixtures thereof.

6. A highly erosion and abrasion wear resistant composite coating system comprising a substrate, an intermediate layer on said substrate of tungsten of sufficient thickness to confer substantial wear resistance characteristics on said coating system, and an outer layer of a mixture of tungsten and tungsten carbide wherein said tungsten carbide is selected from the group consisting of $W_2C$, $W_3C$, or a mixture of both, and wherein the ratio of the thickness of the tungsten intermediate layer to the thickness of the outer layer is at least 0.35 in the case of tungsten plus $W_2C$ in the outer layer, 0.60 in the case of a mixture of tungsten and $W_3C$ in the outer layer and 0.35 in the case of mixtures of tungsten and $W_2C$ and $W_3C$ in the outer layer.

7. A composite coating system according to claim 6 wherein said intermediate layer is at least two microns thick.

8. A composite coating system according to claim 6 wherein said intermediate layer has a substantially columnar grain structure.

9. A composite coating system according to claim 6 wherein said outer layer has a substantially fine-grained, non-columnar and lamellar structure.

10. A composite coating system according to claim 6 wherein said outer layer is substantially crack free.

11. A composite coating system according to claim 6 including a primary layer on the opposite side of said tungsten intermediate layer from said outer layer, said primary layer being comprised substantially of an inert metal selected from the group consisting of cobalt, rhodium, iridium, nickel, palladium, platinum, copper, silver and gold, alloys thereof and mixtures thereof.

12. A highly erosion and abrasion wear resistant composite coating system, comprising an intermediate layer of tungsten having a substantially columnar grain structure and being of sufficient thickness to confer substantial erosion and abrasion wear resistance characteristics on said coating system, and an outer layer of a mixture of tungsten and tungsten carbide wherein said tungsten carbide is selected from the group consisting of $W_2C$, $W_3C$, or a mixture of both, said outer layer having a substantially fine-grained, non-columnar and lamellar structure and being of thickness such that the ratio of the thickness of the tungsten intermediate layer to the thickness of the outer layer is at least about 0.30.

13. A composite coating system according to claim 12 including a primary layer upon the opposite side of said tungsten intermediate layer from said outer layer, said primary layer being comprised substantially of nickel.

14. A highly erosion and abrasion wear resistant composite coating system, comprising a substrate an intermediate layer on a substrate of tungsten having a substantially columnar grain structure and being of sufficient thickness to confer substantial erosion and abrasion wear resistance characteristics on said coating system, and an outer layer of a mixture of tungsten and tungsten carbide wherein said tungsten carbide is selected from the group consisting of $W_2C$, $W_3C$, or a mixture of both, said outer layer having a substantially fine-grained, non-columnar and lamellar structure and being of thickness such that the ratio of the thickness of the intermediate layer to the thickness of the outer layer is at least: 0.35 in the case of mixtures of tungsten and $W_2C$ in the outer layer, 0.60 in the case of mixtures of tungsten and $W_3C$ in the outer layer and, 0.35 in the case of mixtures of tungsten and $W_2C$ and $W_3C$ in the outer layer.

15. A composite coating system according to claim 14 including a primary layer upon the opposite side of said tungsten intermediate layer from said outer layer, said primary layer being comprised substantially of nickel.

16. A composite coating system according to claim 14 wherein said outer layer is substantially crack free.

* * * * *

UNITED STATES PATENT AND TRADEMARK OFFICE

CERTIFICATE OF CORRECTION

PATENT NO. : 4,855,188

DATED : August 8, 1989

INVENTOR(S) : Garg, et al.

It is certified that error appears in the above-identified patent and that said Letters Patent is hereby corrected as shown below:

Claim 12, Column 41, Line 2
following "layer", insert --on said substrate--.

Claim 14, Column 41, Line 20
replace first "a" with --said--

Signed and Sealed this

Fourteenth Day of July, 1992

*Attest:*

DOUGLAS B. COMER

*Attesting Officer*

*Acting Commissioner of Patents and Trademarks*